United States Patent
Hasegawa et al.

(10) Patent No.: US 7,126,797 B2
(45) Date of Patent: Oct. 24, 2006

(54) SPIN VALVE MAGNETORESISTIVE ELEMENT HAVING PINNED MAGNETIC LAYER COMPOSED OF EPITAXIAL LAMINATED FILM HAVING MAGNETIC SUBLAYERS AND NANOMAGNETIC INTERLAYER

(75) Inventors: Naoya Hasegawa, Niigata-ken (JP); Eiji Umetsu, Niigata-ken (JP); Masamichi Saito, Niigata-ken (JP); Yosuke Ide, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 373 days.

(21) Appl. No.: 10/784,014

(22) Filed: Feb. 20, 2004

(65) Prior Publication Data

US 2004/0165321 A1 Aug. 26, 2004

(30) Foreign Application Priority Data

Feb. 26, 2003 (JP) ............................. 2003-048688

(51) Int. Cl.
*G11B 5/39* (2006.01)
(52) U.S. Cl. ................................... 360/324.1
(58) Field of Classification Search ..................... None
See application file for complete search history.

(56) References Cited

U.S. PATENT DOCUMENTS

| 5,648,885 | A | 7/1997 | Nishioka et al. |
| 5,920,446 | A | 7/1999 | Gill |
| 6,295,187 | B1 | 9/2001 | Pinarbasi |
| 6,710,984 | B1 * | 3/2004 | Yuasa et al. ............ 360/324.11 |
| 6,710,985 | B1 * | 3/2004 | Noma .................... 360/324.11 |
| 2002/0044398 | A1 | 4/2002 | Sasaki et al. |

FOREIGN PATENT DOCUMENTS

| JP | 11-86229 | 3/1999 |
| JP | 2000-20926 | 1/2000 |
| JP | 2000-113418 | 4/2000 |
| JP | 2002-94141 | 3/2002 |

* cited by examiner

*Primary Examiner*—A.J. Heinz
(74) *Attorney, Agent, or Firm*—Brinks Hofer Gilson & Lione

(57) ABSTRACT

A magnetic sensor includes a pinned magnetic layer having first and second magnetic sublayers sandwiching a nonmagnetic metal layer. The nonmagnetic metal layer contains at least one of Ru, Re, Os, Ti, Rh, Ir, Pd, Pt, and Al. The atoms in the first magnetic sublayer and the atoms in the nonmagnetic metal layer overlap with each other, while each of the crystal structures is deformed. The deformations in the crystal structure of the first magnetic sublayer increase the magnetostriction constant, thereby increasing the magnetoelastic effect of the magnetic sensor.

52 Claims, 8 Drawing Sheets

SPIN VALVE MAGNETORESISTIVE ELEMENT HAVING PINNED MAGNETIC LAYER COMPOSED OF EPITAXIAL LAMINATED FILM HAVING MAGNETIC SUBLAYERS AND NANOMAGNETIC INTERLAYER

This application claims the benefit of priority to Japanese Patent Application No. 2003-048688, herein incorporated by reference in its entirety.

BACKGROUND OF THE INVENTION

1. Field of the Invention

The present invention relates to a magnetic sensor having a free magnetic layer, a nonmagnetic conductive layer, and a pinned magnetic layer, and in particular, to a magnetic sensor that pins the magnetization of the pinned magnetic layer by means of a uniaxial anisotropy of the pinned magnetic layer itself.

2. Description of the Related Art

Recently, most magnetic heads mounted in magnetic recording and playback devices include a spin valve magnetic sensor that uses the giant magnetoresistive (GMR) effect.

The spin valve magnetic sensor includes a ferromagnetic film called a pinned magnetic layer, a ferromagnetic soft magnetic film called a free magnetic layer, and a nonmagnetic film called a nonmagnetic conductive layer. The nonmagnetic conductive layer is disposed between the pinned magnetic layer and the free magnetic layer.

The magnetization of the free magnetic layer is aligned in a particular direction by a longitudinal bias magnetic field from, for example, a hard bias layer composed of a hard magnetic material. The magnetization of the free magnetic layer is sensitive and is changed in response to an external magnetic field generated from a recording medium. On the other hand, the magnetization of the pinned magnetic layer is pinned in a direction that is perpendicular to the magnetization direction of the free magnetic layer.

The relationship between the changes of magnetization direction of the free magnetic layer and the pinned magnetization direction of the pinned magnetic layer changes the electrical resistance. A leakage field from the recording medium is detected by changes of voltage or current based on the change of the electrical resistance.

In the known spin valve magnetic sensor, the pinned magnetic layer is formed on an antiferromagnetic layer composed of an antiferromagnetic material such as PtMn. An exchange coupling magnetic field is created between the pinned magnetic layer and the antiferromagnetic layer, thereby pinning the magnetization of the pinned magnetic layer.

The exchange coupling magnetic field generated at the boundary between the antiferromagnetic layer and the pinned magnetic layer can be large enough to prevent the change of the magnetization direction of the pinned magnetic layer, due to the application of a magnetic field during the manufacturing process or a leakage field from the recording medium. Furthermore, the antiferromagnetic layer itself does not generate an external magnetic field; therefore, this structure simplifies the design of the magnetic sensor.

However, the antiferromagnetic layer must have a thickness of about 200 Å so that the exchange coupling magnetic field generated at the boundary between the antiferromagnetic layer and the pinned magnetic layer has a sufficient intensity to provide the above benefits.

An antiferromagnetic layer having a large thickness disposed in the laminated component of a magnetic sensor mainly causes a shunt loss of a sense current. In order to achieve a high recording density on the recording medium, the output of the magnetic sensor must be improved. However, the shunt loss of the sense current prevents improvement of the output of the magnetic sensor.

Furthermore, shield layers composed of a soft magnetic material are disposed on the magnetic sensor and under the magnetic sensor in order to effectively read recording signals to be detected. Moreover, in order to achieve a high linear recording density on the recording medium, the distance between the top shield layer and the bottom shield layer must be small. However, an antiferromagnetic layer having a large thickness prevents the distance between the top shield layer and the bottom shield layer from being small.

Referring to FIG. 12, a magnetic sensor that does not have the antiferromagnetic layer has been proposed. The magnetic sensor pins the magnetization of the pinned magnetic layer by means of a uniaxial anisotropy of the pinned magnetic layer itself.

The magnetic sensor shown in FIG. 12 include a multilayer film T having, from the bottom, a bottom gap layer 1, an underlayer 2, a pinned magnetic layer 3 having a synthetic ferrimagnetic structure, a nonmagnetic conductive layer 4, a free magnetic layer 5, and a protective layer 6 in that order. The pinned magnetic layer 3 includes a first magnetic sublayer 3a, a second magnetic sublayer 3c, and a nonmagnetic interlayer 3b disposed therebetween. Furthermore, at both sides 7 of the multilayer film T, bias base layers 8, hard bias layers 9, and electrode layers 10 are formed.

The magnetic sensor shown in FIG. 12 does not have the antiferromagnetic layer that is overlapped with the pinned magnetic layer 3. According to this magnetic sensor, the magnetization of the pinned magnetic layer 3 is pinned in the Y direction shown in the figure by means of the uniaxial anisotropy of the pinned magnetic layer 3 itself. Accordingly, the shunt loss can be small compared with a known magnetic sensor having the antiferromagnetic layer. Thus, the output in detecting the magnetic field of the magnetic sensor can be improved by 20% to 30%. Furthermore, the distance between the top shield layer and the bottom shield layer, which are disposed on and under the magnetic sensor, respectively, can be small, thereby achieving a higher linear recording density on the recording medium.

Japanese Unexamined Patent Application Publication Nos. 8-7235 (pp. 8 and 9, FIG. 5) and 2000-113418 (pp. 7 and 8, FIGS. 4, 5, 6, and 7) disclose the magnetic sensor shown in FIG. 12.

The magnetic sensor described in Japanese Unexamined Patent Application Publication No. 8-7235 includes a buffer layer 62, i.e., an underlayer, composed of tantalum (Ta), and a pinned ferromagnetic layer 70 disposed thereon. The pinned ferromagnetic layer 70 includes a first cobalt (Co) film 72, a second cobalt (Co) film 74, and a ruthenium (Ru) film 73 disposed therebetween. The magnetization of the first cobalt (Co) film 72 and the second cobalt (Co) film 74 is pinned by each of the anisotropy fields. The first cobalt (Co) film 72 and the second cobalt (Co) film 74 are antiferromagnetically bonded to each other. The first cobalt (Co) film 72 and the second cobalt (Co) film 74 are magnetized in antiparallel directions.

As described above, the magnetic sensor described in Japanese Unexamined Patent Application Publication No. 8-7235 includes the buffer layer composed of tantalum having cobalt (Co) films thereon. Unfortunately, this structure cannot appropriately pin the magnetization direction of the pinned ferromagnetic layer 70. Japanese Unexamined Patent Application Publication No. 2000-113418 also points out this problem.

The magnetic sensor described in Japanese Unexamined Patent Application Publication No. 2000-113418 was invented in order to solve the problem in Japanese Unexamined Patent Application Publication No. 8-7235. According to this magnetic sensor, ferromagnetic layers in a laminated ferrimagnetic pinned layer are composed of CoFe or CoFeNi, thereby improving the induced anisotropy.

Furthermore, Japanese Unexamined Patent Application Publication No. 2000-113418 discloses an underlayer composed of Ta, the underlayer being disposed under the laminated ferrimagnetic pinned layer. Referring to experimental results in which the presence of the Ta underlayer is compared (see FIGS. 4, 5, 6, and 7 in Japanese Unexamined Patent Application Publication No. 2000-113418), when using CoFe alloy as the ferromagnetic layers, a magnetic sensor that does not have the Ta underlayer has a larger magnetoresistance change and a larger coercive force than those of the magnetic sensor that has the Ta underlayer.

In Japanese Unexamined Patent Application Publication No. 2000-113418, CoFe alloy is used as the ferromagnetic layers, and the ferromagnetic layers have a positive magnetostriction in order to increase the induced anisotropy of the laminated ferrimagnetic pinned layer.

One factor to pin the magnetization of the self-pinning type pinned magnetic layer is the uniaxial anisotropy due to magnetoelastic energy of the pinned magnetic layer. In particular, one may optimize the magnetostriction of the pinned magnetic layer. However, Japanese Unexamined Patent Application Publication No. 2000-113418 does not consider or discuss optimization of the magnetostriction of the pinned magnetic layer let alone disclose a specific construction to optimize the magnetostriction of the pinned magnetic layer.

SUMMARY OF THE INVENTION

To the contrary, the present invention provides a magnetic sensor having a self-pinning type pinned magnetic layer in which the magnetization of the pinned magnetic layer is strongly pinned. In the present invention, the mechanism to control the magnetostriction of the pinned magnetic layer is made clear, and the material of a nonmagnetic metal layer that is in contact with the pinned magnetic layer is appropriately selected in order to appropriately regulate the magnetostriction.

The present invention provides a magnetic sensor including a pinned magnetic layer, a free magnetic layer, and a nonmagnetic conductive layer disposed therebetween. The pinned magnetic layer includes a plurality of laminated magnetic sublayers having a nonmagnetic interlayer therebetween. A first magnetic sublayer of the plurality of the magnetic sublayers is disposed farthest from the nonmagnetic conductive layer and is in contact with a nonmagnetic metal layer composed of at least one element selected from the group consisting of Ru, Re, Os, Ti, Rh, Ir, Pd, Pt, and Al. The crystals in the nonmagnetic metal layer and the crystals in the first magnetic sublayer are oriented in an epitaxial or a heteroepitaxial state. An end face of the pinned magnetic layer is open and opposes a face of a recording medium.

An epitaxial state is a state in which the types of crystal lattice (e.g. fcc, bcc, hcp) of the nonmagnetic metal layer and the first magnetic sublayer are the same and the atoms are substantially aligned, albeit the crystal is deformed at the boundary due to the difference in lattice constants of the different materials. Conversely, a heteroepitaxial state is a state in which the types of crystal lattice of the nonmagnetic metal layer and the first magnetic sublayer are different while the atoms are substantially aligned and the crystals are deformed, as in the epitaxial state. A non-epitaxial state is a state in which dislocations of the crystal at the boundary relieve strain at the boundary and the atoms are not substantially aligned, no matter whether the crystal lattice types of the nonmagnetic metal layer and the first magnetic sublayer are the same or different.

In one embodiment of the magnetic sensor of the present invention, the magnetic sensor does not have an antiferromagnetic layer that is overlapped with the pinned magnetic layer. Thus, the magnetization of the pinned magnetic layer is pinned by means of the uniaxial anisotropy of the pinned magnetic layer itself. That is, the magnetic sensor of the present invention is a self-pinning type magnetic sensor.

Accordingly, the shunt loss can be small compared with known magnetic sensors having an antiferromagnetic layer. Thus, the output in detecting the magnetic field of the magnetic sensor can be improved by 20% to 30%. Furthermore, the distance between a top shield layer and a bottom shield layer, which are disposed on and under the magnetic sensor, respectively, can be small, thereby achieving a higher linear recording density on the recording medium.

The factors that determine a magnetic anisotropy-magnetic field of a ferromagnetic layer include the crystal magnetic anisotropy, the induced magnetic anisotropy and the magnetoelastic effect. With regard to the crystal magnetic anisotropy, it is difficult to arrange the anisotropy uniaxially in a layer having crystals in which polycrystals orient at random. On the other hand, with regard to the induced magnetic anisotropy, a uniaxis is obtained by applying a magnetic field in one direction during deposition or heat treatment, and with regard to the magnetoelastic effect, the uniaxis is obtained by applying a uniaxial stress.

The uniaxial anisotropy to pin the magnetization of the pinned magnetic layer is determined by the induced magnetic anisotropy and the magnetoelastic effect. The present invention is achieved, at least in part, using the magnetoelastic effect.

The magnetoelastic effect is controlled by magnetoelastic energy. The magnetoelastic energy is defined by the stress on the pinned magnetic layer and the magnetostriction constant of the pinned magnetic layer.

According to the present invention, an end face of the pinned magnetic layer is opened, the end face opposing a face of a recording medium. Accordingly, the symmetry of the stress is lost, and a tensile strength is applied to the pinned magnetic layer in the height direction of the sensor (the height direction, or the direction of the normal line to the opposing face).

According to the present invention, the increase of the magnetostriction constant of the pinned magnetic layer increases the magnetoelastic energy, thereby increasing the uniaxial anisotropy of the pinned magnetic layer. The increase of uniaxial anisotropy of the pinned magnetic layer allows the magnetization of the pinned magnetic layer to be strongly pinned in one direction. Furthermore, the increase of uniaxial anisotropy of the pinned magnetic layer increases the output of the magnetic sensor and improves the output stability and the symmetry.

Specifically, the first magnetic sublayer, which is one of the plurality of magnetic layers of the pinned magnetic layer, is bonded with the nonmagnetic metal layer composed of at least one element selected from the group consisting of Ru, Re, Os, Ti, Rh, Ir, Pd, Pt, and Al such that the first magnetic sublayer and the nonmagnetic metal layer are oriented in an epitaxial or a heteroepitaxial state. Thus, deformation occurs in the crystal structure of the first magnetic sublayer, thereby increasing the magnetostriction constant $\lambda$ of the first magnetic sublayer.

When the nonmagnetic metal layer is composed of at least one element selected from the group consisting of Rh, Ir, Pd, Pt, and Al, the nonmagnetic metal layer has a face-centered cubic (fcc) lattice structure in the vicinity of a boundary adjacent to the first magnetic sublayer of the pinned magnetic layer or throughout the nonmagnetic metal layer, an equivalent crystal plane represented by a {111} plane is oriented in the direction parallel to the boundary.

When the nonmagnetic metal layer is composed of at least one element selected from the group consisting of Ru, Re, Os, and Ti, the nonmagnetic metal layer has a hexagonal close-packed (hcp) structure in the vicinity of a boundary adjacent to the first magnetic sublayer of the pinned magnetic layer or throughout the nonmagnetic metal layer, a C-plane ({0001} plane) is oriented in the direction parallel to the boundary.

Bias layers to supply the free magnetic layer with a longitudinal bias magnetic field are formed at both side ends of the free magnetic layer and the pinned magnetic layer.

According to the present invention, the first magnetic sublayer of the pinned magnetic layer has a face-centered cubic (fcc) lattice structure in the vicinity of a boundary adjacent to the nonmagnetic metal layer or throughout the first magnetic sublayer, an equivalent crystal plane represented by a {111} plane being oriented in the direction parallel to the boundary.

As described above, the nonmagnetic metal layer of the present invention has an fcc structure, and an equivalent crystal plane represented by the {111} plane being oriented in the direction parallel to the boundary. Alternatively, the nonmagnetic metal layer has an hcp structure, and the C-plane being oriented in the direction parallel to the boundary.

Accordingly, when the first magnetic sublayer has an fcc structure, and an equivalent crystal plane represented by the {111} plane being oriented in the direction parallel to the boundary, the atoms in the first magnetic sublayer and the atoms in the nonmagnetic metal layer readily overlap with each other.

However, there is a certain amount of difference between the nearest interatomic distance in the {111} plane of the first magnetic sublayer and the nearest interatomic distance in the {111} plane or in the C-plane of the nonmagnetic metal layer. Accordingly, in the vicinity of the boundary between the first magnetic sublayer and the nonmagnetic metal layer, the atoms in the first magnetic sublayer and the atoms in the nonmagnetic metal layer overlap with each other, while each of the crystal structures is deformed. Thus, the generation of the deformations in the crystal structure of the first magnetic sublayer can increase the magnetostriction constant $\lambda$.

For example, when the first magnetic sublayer of the pinned magnetic layer is composed of Co or $Co_xFe_y$ ($20 \geq y$, x+y=100, and wherein each of x and y is represented as an atomic percent), the first magnetic sublayer has an fcc structure, an equivalent crystal plane represented by a {111} plane being oriented in the direction parallel to the boundary.

Alternatively, the first magnetic sublayer of the pinned magnetic layer has a body-centered cubic (bcc) lattice structure in the vicinity of a boundary adjacent to the nonmagnetic metal layer or in the entire areas of the first magnetic sublayer, an equivalent crystal plane represented by a {110} plane being oriented in the direction parallel to the boundary.

Even when the first magnetic sublayer has a bcc structure, an equivalent crystal plane represented by the {110} plane being oriented in the direction parallel to the boundary, the atoms in the first magnetic sublayer and the atoms in the nonmagnetic metal layer are readily overlapped with each other.

In this case, there is also a certain amount of difference between the nearest interatomic distance in the {110} plane of the first magnetic sublayer and the nearest interatomic distance in the {111} plane or in the C-plane of the nonmagnetic metal layer. Accordingly, in the vicinity of the boundary between the first magnetic sublayer and the nonmagnetic metal layer, the atoms in the first magnetic sublayer and the atoms in the nonmagnetic metal layer are overlapped with each other, while each of the crystal structures is deformed. Thus, the generation of the deformations in the crystal structure of the first magnetic sublayer can increase the magnetostriction constant $\lambda$.

For example, when the first magnetic sublayer of the pinned magnetic layer is composed of $Co_xFe_y$ ($y \geq 20$, x+y=100, and wherein each of x and y is represented as an atomic percent), the first magnetic sublayer has a bcc structure, an equivalent crystal plane represented by the {110} plane being oriented in the direction parallel to the boundary. Since $Co_xFe_y$ ($y \geq 20$, x+y=100) having a bcc structure has a magnetostriction constant $\lambda$ larger than that of Co or $Co_xFe_y$ ($20 \geq y$, x+y=100, and wherein each of x and y is represented as an atomic percent) having an fcc structure, this material allows a larger magnetoelastic effect to be achieved. Furthermore, the $Co_xFe_y$ ($y \geq 20$, x+y=100) having a bcc structure has a large coercive force, and allows the magnetization of the pinned magnetic layer to be strongly pinned. However, when the iron content y of the $Co_xFe_y$ is about 20 (atomic percent), this material may have a mixed structure including an fcc structure and a bcc structure.

Furthermore, according to the present invention, the first magnetic sublayer of the pinned magnetic layer may have a face-centered cubic (fcc) lattice structure in the vicinity of a boundary adjacent to the nonmagnetic metal layer, an equivalent crystal plane represented by the {111} plane being oriented in the direction parallel to the boundary; and the first magnetic sublayer of the pinned magnetic layer has a body-centered cubic (bcc) lattice structure in the vicinity of a boundary adjacent to the nonmagnetic interlayer, an equivalent crystal plane represented by the {110} plane being oriented in the direction parallel to the boundary.

When the vicinity of the boundary of the first magnetic sublayer adjacent to the nonmagnetic interlayer has a bcc structure, the magnetostriction constant $\lambda$ is increased, thereby achieving a larger magnetoelastic effect. On the other hand, when the vicinity of the boundary of the first magnetic sublayer adjacent to the nonmagnetic metal layer has an fcc structure, the pinned magnetic layer, nonmagnetic conductive layer, and the free magnetic layer readily have a constant crystal orientation, thereby increasing the magnetoresistance ratio (MR ratio).

For example, the first magnetic sublayer of the pinned magnetic layer is composed of $Co_xFe_y$ ($20 \geq y$, x+y=100) or Co in the vicinity of the boundary adjacent to the nonmagnetic metal layer; and the first magnetic sublayer of the pinned magnetic layer is composed of $Co_xFe_y$ ($y \geq 20$, x+y=100) in the vicinity of the boundary adjacent to the nonmagnetic interlayer. In this case, the first magnetic sublayer of the pinned magnetic layer has an fcc structure in the vicinity of a boundary adjacent to the nonmagnetic metal layer, an equivalent crystal plane represented by the {111} plane being oriented in the direction parallel to the boundary; and the first magnetic sublayer of the pinned magnetic layer has a bcc structure in the vicinity of a boundary adjacent to the nonmagnetic interlayer, an equivalent crystal plane represented by the {110} plane being oriented in the direction parallel to the boundary.

Furthermore, the first magnetic sublayer of the pinned magnetic layer is composed of $Co_xFe_y$ ($y \geq 20$, $x+y=100$) in the vicinity of the boundary adjacent to the nonmagnetic interlayer because the Ruderman-Kittel-Kasuya-Yoshida (RKKY) interaction between the first magnetic sublayer and other magnetic sublayer via the nonmagnetic interlayer can be increased.

The iron content in the first magnetic sublayer of the pinned magnetic layer may gradually increase from the boundary adjacent to the nonmagnetic metal layer to the boundary adjacent to the nonmagnetic interlayer.

According to the present invention, in order to overlap the atoms in the nonmagnetic metal layer and the atoms in the first magnetic sublayer and to generate deformations in the crystal structure, the difference between the nearest interatomic distance of the nonmagnetic metal layer in the plane parallel to the boundary and the nearest interatomic distance of the first magnetic sublayer of the pinned magnetic layer in the plane parallel to the boundary divided by the nearest interatomic distance of the first magnetic sublayer is in the range of 0.05 to 0.20.

An interlayer is disposed between the nonmagnetic metal layer and the first magnetic sublayer of the pinned magnetic layer, the interlayer being composed of PtMn alloy or X—Mn alloy (wherein X is at least one element selected from the group consisting of Pd, Ir, Rh, Ru, Os, Ni, and Fe). In this case, the crystals in the nonmagnetic metal layer and the crystals in the interlayer are readily oriented in an epitaxial state, and the crystals in the interlayer and the crystals in the pinned magnetic layer are readily oriented in an epitaxial or a heteroepitaxial state.

The first magnetic sublayer may be composed of a magnetic material having a positive magnetostriction constant.

Electrode layers composed of Cr, α-Ta, or Rh are disposed at both sides of the free magnetic layer, the nonmagnetic conductive layer, and the pinned magnetic layer. In this case, the compressive stress in the track width direction (i.e., the tensile stress in the height direction) applied to the pinned magnetic layer can be increased.

The distance between the crystal planes of the electrode layers composed of Cr in the direction parallel to the layers is 0.2044 nm (the distance between the {110} planes in a bcc structure) or more; the distance between the crystal planes of the electrode layers composed of α-Ta in the direction parallel to the layers is 0.2337 nm (the distance between the {110} planes in a bcc structure) or more; or the distance between the crystal planes of the electrode layers composed of Rh in the direction parallel to the layers is 0.2200 nm (the distance between the {111} planes in an fcc structure) or more.

The magnetic sensor of the present invention is useful, in particular, in reduction in size. In particular, an optical track width of the pinned magnetic layer is 0.15 µm or less.

According to the present invention described above in detail, in the magnetic sensor having the self-pinning type pinned magnetic layer, the mechanism to control the magnetostriction of the pinned magnetic layer is made clear, and the material of the nonmagnetic metal layer that is in contact with the pinned magnetic layer is appropriately selected. Thus, the present invention can provide a magnetic sensor that appropriately regulates the magnetostriction to strongly pin the magnetization of the pinned magnetic layer.

DESCRIPTION OF THE PREFERRED EMBODIMENTS

Figure 1:
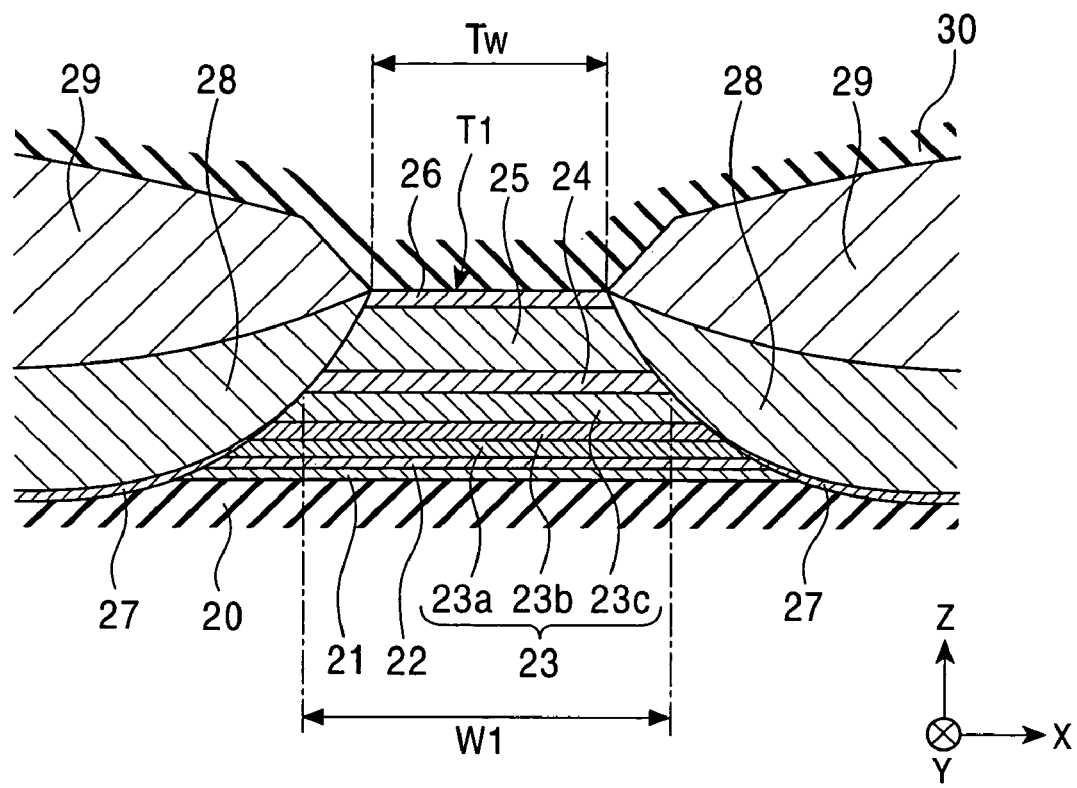
FIG. 1 is a sectional view of a magnetic sensor according to a first embodiment of the present invention, viewed from a surface facing a recording medium.

FIG. 1 is a sectional view of a magnetic sensor according to a first embodiment of the present invention, viewed from a surface facing a recording medium.

According to the magnetic sensor shown in FIG. 1, a multilayer film T1 is formed on a bottom gap layer 20 composed of an insulating material such as alumina.

According to the first embodiment shown in FIG. 1, the multilayer film T1 is formed by laminating, from the bottom, a seed layer 21, a nonmagnetic metal layer 22, a pinned magnetic layer 23, a nonmagnetic conductive layer 24, a free magnetic layer 25, and a protective layer 26 in that order.

The seed layer 21 is composed of, for example, NiFe alloy, NiFeCr alloy, Cr, or Ta. For example, the seed layer 21 is composed of $(Ni_{0.8}Fe_{0.2})_{60\ at\ \%}Cr_{40\ at\ \%}$, and has a thickness of 35 Å to 60 Å.

The seed layer 21 improves the {111} orientation of the nonmagnetic metal layer 22.

The nonmagnetic metal layer 22 will be described later.

The pinned magnetic layer 23 includes a first magnetic sublayer 23a, a second magnetic sublayer 23c, and a nonmagnetic interlayer 23b disposed therebetween. The pinned magnetic layer 23 has a synthetic ferrimagnetic structure. The magnetization of the pinned magnetic layer 23 is pinned in the height direction (in the Y direction in the figure) by means of the uniaxial anisotropy of the pinned magnetic layer 23 itself.

The nonmagnetic conductive layer 24 prevents a magnetic bond between the pinned magnetic layer 23 and the free magnetic layer 25. The nonmagnetic conductive layer 24 is composed of a conductive nonmagnetic material such as Cu, Cr, Au, Ag, or Cu. The nonmagnetic conductive layer 24 has a thickness of 17 Å to 30 Å.

The free magnetic layer 25 is composed of a magnetic material such as NiFe alloy or CoFe alloy. According to the first embodiment shown in FIG. 1, when the free magnetic layer 25 is composed of, in particular, NiFe alloy, a diffusion barrier layer (not shown in the figure) composed of, for example, Co or CoFe, is formed between the free magnetic layer 25 and the nonmagnetic conductive layer 24. The free magnetic layer 25 has a thickness of 20 Å to 60 Å. The free magnetic layer 25 may have a synthetic ferrimagnetic structure in which a plurality of magnetic sublayers is laminated with a nonmagnetic interlayer therebetween.

The protective layer 26, which is composed of, for example, Ta, suppresses oxidation of the multilayer film T1. The protective layer 26 has a thickness of 10 Å to 50 Å.

According to the first embodiment shown in FIG. 1, at both sides of the multilayer film T1 that includes from the seed layer 21 to the protective layer 26, bias base layers 27, hard bias layers 28, and electrode layers 29 are formed. The magnetization of the free magnetic layer 25 is aligned in the track width direction (in the X direction in the figure) by a longitudinal bias magnetic field from the hard bias layers 28.

The bias base layers 27 are composed of Cr, W, or Ti. The hard bias layers 28 are composed of, for example, Co—Pt (cobalt-platinum) alloy or Co—Cr—Pt (cobalt—chromium—platinum) alloy. The electrode layers 29 are composed of, for example, Cr, Ta, Rh, Au; or W (tungsten).

The bias base layers 27 have a thickness of 20 Å to 100 Å. The hard bias layers 28 have a thickness of 100 Å to 400 Å. The electrode layers 29 have a thickness of 400 Å to 1,500 Å.

A top gap layer 30 composed of an insulating material such as alumina is formed on the electrode layers 29 and the protective layer 26. Although not shown in the figure, a bottom shield layer is formed under the bottom gap layer 20 and a top shield layer is formed on the top gap layer 30. The bottom shield layer and the top shield layer are composed of a soft magnetic material such as NiFe. Each of the top gap layer 30 and the bottom gap layer 20 has a thickness of 50 Å to 300 Å.

The magnetization of the free magnetic layer 25 is aligned in the track width direction (in the X direction in the figure) by a longitudinal bias magnetic field from the hard bias layers 28. The magnetization of the free magnetic layer 25 is sensitively changed in response to a signal magnetic field (an external magnetic field) generated from the recording medium. On the other hand, the magnetization of the pinned magnetic layer 23 is pinned in the height direction (in the Y direction in the figure).

The relationship between the changes of magnetization direction of the free magnetic layer 25 and the pinned magnetization direction of the pinned magnetic layer 23 (in particular, the pinned magnetization direction of the second magnetic sublayer 23c) changes the electrical resistance. A leakage field from the recording medium is detected by changes of voltage or current based on the change of the electrical resistance.

The features of the present embodiment will now be described.

The pinned magnetic layer 23 of the magnetic sensor shown in FIG. 1 includes a first magnetic sublayer 23a, a second magnetic sublayer 23c, and a nonmagnetic interlayer 23b disposed therebetween. The pinned magnetic layer 23 has the synthetic ferrimagnetic structure. The magnetization of the first magnetic sublayer 23a and the magnetization of the second magnetic sublayer 23c are aligned in antiparallel directions with respect to each other by the Ruderman-Kittel-Kasuya-Yoshida (RKKY) interaction via the nonmagnetic interlayer 23b.

The distance from the first magnetic sublayer 23a to the nonmagnetic conductive layer 24 is larger than the distance from the second magnetic sublayer 23c to the nonmagnetic conductive layer 24. The first magnetic sublayer 23a is in contact with the nonmagnetic metal layer 22.

The nonmagnetic metal layer 22 is composed of at least one element selected from the group consisting of Ru, Re, Os, Ti, Rh, Ir, Pd, Pt, and Al. The nonmagnetic metal layer 22 has a thickness of 5 Å to 30 Å.

The magnetic sensor shown in FIG. 1 does not have an antiferromagnetic layer that overlaps with the pinned magnetic layer 23. According to this magnetic sensor, the magnetization of the pinned magnetic layer 23 is pinned by means of the uniaxial anisotropy of the pinned magnetic layer 23 itself, that is, the magnetic sensor is a self-pinning type magnetic sensor. Accordingly, the shunt loss is small compared with a magnetic sensor having an antiferromagnetic layer. Thus, the output in detecting the magnetic field of the magnetic sensor can be improved by 20% to 30%. In addition, the distance between the top shield layer and the bottom shield layer, which are disposed on and under the magnetic sensor, respectively, is small. This permits a higher linear recording density on the recording medium to be achieved.

According to the first embodiment, the second magnetic sublayer 23c has a thickness larger than the thickness of the first magnetic sublayer 23a. The magnetization direction of the second magnetic sublayer 23c is pinned in the height direction (in the Y direction in the figure), and the magnetization direction of the first magnetic sublayer 23a is pinned in the direction antiparallel to the height direction.

The first magnetic sublayer 23a has a thickness of 10 Å to 30 Å, and the second magnetic sublayer 23c has a thickness of 15 Å to 35 Å. A first magnetic sublayer 23a having a large thickness increases the coercive force but also increases the shunt loss. As described later, the first magnetic sublayer 23a is matched with the nonmagnetic metal layer 22, thereby generating deformations in the crystal structure. The deformations increase the magnetostriction constant $\lambda$ and the uniaxial anisotropy. However, increasing the thickness of the first magnetic sublayer 23a decreases the deformations generated in the first magnetic sublayer 23a, thereby decreasing the magnetostriction constant $\lambda$ and the uniaxial anisotropy.

The uniaxial anisotropy to pin the magnetization of the pinned magnetic layer 23 is determined by the induced magnetic anisotropy and magnetoelastic effect. The present invention mainly utilizes the magnetoelastic effect.

The magnetoelastic effect is controlled by the magnetoelastic energy. The magnetoelastic energy is defined by the stress $\sigma$ on the pinned magnetic layer 23 and the magnetostriction constant $\lambda$ of the pinned magnetic layer 23.

Figure 2:
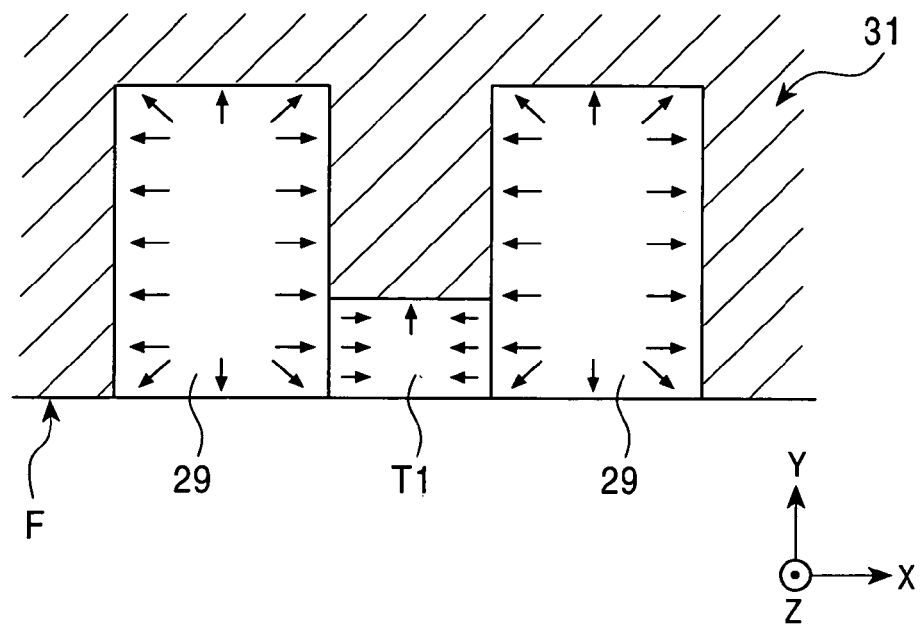
FIG. 2 is a plan view of the magnetic sensor shown in FIG. 1.

FIG. 2 is a plan view of the magnetic sensor shown in FIG. 1, viewed from the upper side in the figure (the direction opposite to the Z direction in FIG. 2). The multilayer film T1 of the magnetic sensor is formed between a pair of bias base layers 27, hard bias layers 28, and electrode layers 29. FIG. 2 does not show the bias base layers 27 and the hard bias layers 28, because these layers are disposed under the electrode layers 29. An insulating layer 31, shown by diagonal lines, fills the space around the multilayer film T1 the bias base layers 27, the hard bias layers 28, and the electrode layers 29.

An end face F of the multilayer film T1, the bias base layers 27, the hard bias layers 28, and the electrode layers 29, is exposed (as shown in FIG. 2) or just covered with a thin protective layer (not shown in FIG. 2). The end face F opposes a face of the recording medium. The thin protective layer is composed of, for example, diamond like carbon (DLC), and has a thickness of 20 Å to 50 Å. That is, the end face F is an open end.

Accordingly, the stresses from the bottom gap layer 20 and the top gap layer 30, both of which were originally two-dimensionally isotropic, is relieved at the end face F. As a result, the symmetry is lost, and a tensile stress is applied to the multilayer film T1 in the direction parallel to the height direction (the Y direction in FIG. 2). When the laminated films composed of the bias base layers 27, the hard bias layers 28, and the electrode layers 29 have a compressible internal stress, the layers such as the electrode layers try to extend in the longitudinal directions. Accordingly, a compressive stress is applied to the multilayer film T1 in the parallel direction and the antiparallel direction with respect to the track width direction (the X direction in FIG. 2).

That is, the tensile stress in the height direction and the compressive stress in the track width direction are applied to the pinned magnetic layer 23, of which the end face F opposing the face of the recording medium is open. The first magnetic sublayer 23a is composed of a magnetic material having a positive magnetostriction constant. Accordingly, the easy magnetization axis of the first magnetic sublayer 23a is parallel to the inner part of the magnetic sensor (the height direction, or the Y direction in FIG. 2) due to the magnetoelastic effect. The magnetization direction of the first magnetic sublayer 23a is pinned in the direction parallel to the height direction or antiparallel to the height direction. The magnetization of the second magnetic sublayer 23c is pinned in the direction antiparallel to the magnetization direction of the first magnetic sublayer 23a by the RKKY interaction via the nonmagnetic interlayer 23b.

According to the present invention, the increase of the magnetostriction constant of the pinned magnetic layer 23 increases the magnetoelastic energy, thereby increasing the uniaxial anisotropy of the pinned magnetic layer 23. The increase of uniaxial anisotropy of the pinned magnetic layer 23 allows the magnetization of the pinned magnetic layer 23 to be strongly pinned in one direction. Furthermore, the increase of uniaxial anisotropy of the pinned magnetic layer 23 increases the output of the magnetic sensor and improves the output stability and the symmetry.

Specifically, the first magnetic sublayer 23a of the pinned magnetic layer 23 is bonded with the nonmagnetic metal layer 22 to generate deformations in the crystal structure of the first magnetic sublayer 23a. Thus, the magnetostriction constant $\lambda$ of the first magnetic sublayer 23a is increased. The nonmagnetic metal layer 22 is composed of at least one element selected from the group consisting of Ru, Re, Os, Ti, Rh, Ir, Pd, Pt, and Al.

When the nonmagnetic metal layer 22 is composed of at least one element selected from the group consisting of Rh, Ir, Pd, Pt, and Al, the nonmagnetic metal layer 22 has a face-centered cubic (fcc) structure. In this case, an equivalent crystal plane represented by a {111} plane is oriented in the direction parallel to the boundary. When the nonmagnetic metal layer 22 is composed of at least one element selected from the group consisting of Ru, Re, Os, and Ti, the nonmagnetic metal layer 22 has a hexagonal close-packed (hcp) structure. In this case, a C-plane ({0001} plane) is oriented in the direction parallel to the boundary.

On the other hand, when the first magnetic sublayer 23a of the pinned magnetic layer 23 is composed of Co or Co Fe$_y$ (20≧y, x+y=100), the first magnetic sublayer 23a has a face-centered cubic (fcc) lattice structure. In the first magnetic sublayer 23a, an equivalent crystal plane represented by the {111} plane is oriented in the direction parallel to the boundary.

Accordingly, the atoms in the first magnetic sublayer 23a and the atoms in the nonmagnetic metal layer 22 readily overlap with each other, and the crystals in the nonmagnetic metal layer 22 and the crystals in the pinned magnetic layer 23 are oriented in an epitaxial state (in which the cubic structures of the non-magnetic metal layer 22 and the fixed magnetic layer 23 are the same, here fcc, and the atoms of the structures are substantially aligned, thereby straining the lattices).

However, a certain amount of difference is required between the nearest interatomic distance in the {111} plane of the first magnetic sublayer 23a and the nearest interatomic distance in the {111} plane or in the C-plane of the nonmagnetic metal layer 22.

According to the first embodiment, in order to overlap the atoms in the nonmagnetic metal layer 22 and the atoms in the first magnetic sublayer 23a, and to generate deformations in the crystal structure, a value (hereinafter referred to as mismatch value) is controlled in the range of 0.05 to 0.20. The mismatch value is defined as follows: the difference between the nearest interatomic distance in the {111} plane or in the C-plane of the nonmagnetic metal layer 22 and the-nearest interatomic distance in the {111} plane of the first magnetic sublayer 23a of the pinned magnetic layer 23 is divided by the nearest interatomic distance in the {111} plane of the first magnetic sublayer 23a.

Table 1 shows lattice constants of crystals having an fcc structure, the nearest interatomic distances in the {111} plane of the crystals having an fcc structure, and the mismatch percentage (mismatch %) of the crystals having an fcc structure with Co having an fcc structure. The mismatch percentage is calculated by multiplying the mismatch value by 100, and is represented as a percentage.

Table 2 shows the nearest interatomic distances (that correspond to the lattice constants a) in the C-plane of crystals having an hcp structure and the mismatch percentage of the crystals having an hcp structure with Co having an fcc structure.

TABLE 1

| Material | Lattice Constant (Å) | Nearest Interatomic Distance | Mismatch Percentage with Co (%) |
|---|---|---|---|
| Co (fcc) | 3.545 | 2.506 | |
| Ph | 3.803 | 2.689 | 7.290 |
| Pd | 3.890 | 2.751 | 9.736 |
| Ir | 3.839 | 2.715 | 8.314 |
| Pt | 3.923 | 2.774 | 10.675 |
| Al | 4.049 | 2.863 | 14.238 |
| Below: | | | |
| Comparative Examples | | | |

TABLE 1-continued

|  | Lattice Constant (Å) | Nearest Interatomic Distance | Mismatch Percentage with Co (%) |
|---|---|---|---|
| $(Ni_{0.8}Fe_{0.2})_{60}Cr_{40}$ | 3.568 | 2.523 | 0.657 |
| Cu | 3.615 | 2.556 | 1.995 |
| $Ni_{80}Fe_{20}$ | 3.549 | 2.509 | 0.120 |
| Si | 5.430 | 3.840 | 53.189 |
| Ge | 5.658 | 4.001 | 59.607 |
| Pb | 4.951 | 3.501 | 39.662 |

TABLE 2

| Material | Lattice Constant a (Å) | Mismatch Percentage with Co (%) |
|---|---|---|
| Ru | 2.706 | 7.952 |
| Ti | 2.950 | 17.695 |
| Re | 2.760 | 10.115 |
| Os | 2.734 | 9.081 |
| Below: Comparative Examples | | |
| Hf | 3.197 | 27.537 |
| Zr | 3.232 | 28.946 |

Referring to Table 1, the mismatch percentage between Co (which has an fcc structure) and crystalline Rh, crystalline Ir, crystalline Pd crystalline, Pt, and crystalline Al is in the range of 7% to 14% (i.e., the mismatch value is in the range of 0.07 to 0.14). Referring to Table 2, the mismatch percentage between Co and crystalline Ru, crystalline Re, crystalline Os, and crystalline Ti is in the range of 7% to 18% (i.e., the mismatch value is in the range of 0.07 to 0.18).

Figure 3:
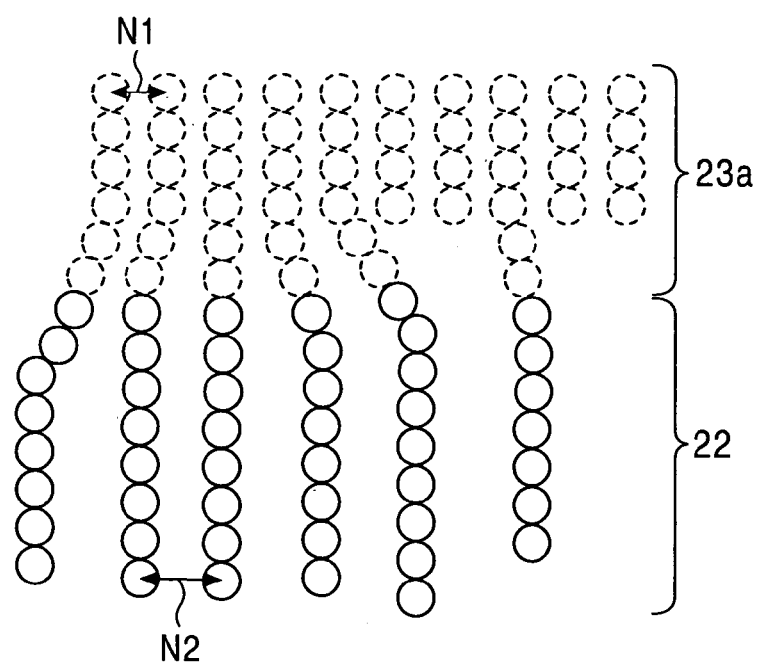
FIG. 3 is a schematic view showing a nonmagnetic metal layer and a pinned magnetic layer are matched, while deformations are generated.

As schematically shown in FIG. 3, when the mismatch percentage between the nonmagnetic metal layer 22 and the first magnetic sublayer 23a, both of which are overlapped, is from 5% to 20% (or the mismatch value is from 0.05 to 0.20), the atoms in the nonmagnetic metal layer 22 and the atoms in the first magnetic sublayer 23a are overlapped, while the crystal structure is deformed in the vicinity of the boundary.

In FIG. 3, a symbol N1 indicates the nearest interatomic distance in the {111} plane of the first magnetic sublayer 23a, and a symbol N2 indicates the nearest interatomic distance in the {111} plane or in the C-plane of the nonmagnetic metal layer 22. The values of N1 and N2 are measured at locations that are remote enough from the boundary between the nonmagnetic metal layer 22 and the first magnetic sublayer 23a to remain essentially unaffected by the deformations.

Thus, the generation of deformations in the crystal structure of the first magnetic sublayer 23a increases the magnetostriction constant λ of the first magnetic sublayer 23a, thereby increasing the magnetoelastic effect.

Figure 4:
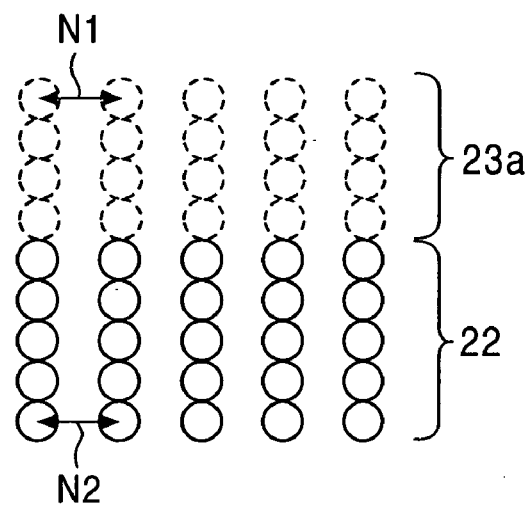
FIG. 4 is a schematic view showing the nonmagnetic metal layer and the pinned magnetic layer are matched.

If the nonmagnetic metal layer 22 is composed of $(Ni_{0.8}Fe_{0.2})_{60}Cr_{40}$, Cu, or, $Ni_{80}Fe_{20}$, (in which the subscript indicates atomic percent) and the first magnetic sublayer 23a is composed of Co, the mismatch percentage between the nonmagnetic metal layer 22 and the first magnetic sublayer 23a is too small. That is, as schematically shown in FIG. 4, when the atoms in the nonmagnetic metal layer 22 and the atoms in the first magnetic sublayer 23a are overlapped, deformations of the crystal structure in the vicinity of the boundary do not occur. Accordingly, the magnetostriction constant λ of the first magnetic sublayer 23a cannot be increased.

Figure 5:
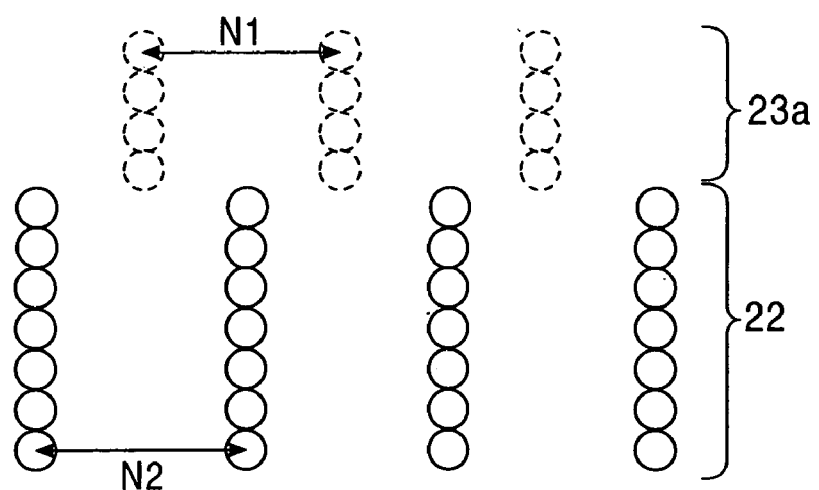
FIG. 5 is a schematic view showing the nonmagnetic metal layer and the pinned magnetic layer are mismatched.

If the nonmagnetic metal layer 22 is composed of Si, Ge, Pb, Hf, or Zr, and the first magnetic sublayer 23a is composed of Co, the mismatch percentage between the nonmagnetic metal layer 22 and the first magnetic sublayer 23a is too large. That is, as schematically shown in FIG. 5, the atoms in the nonmagnetic metal layer 22 and the atoms in the first magnetic sublayer 23a do not overlap, and are mismatched (i.e. are in a non-epitaxial state). When the atoms in the nonmagnetic metal layer 22 and the atoms in the first magnetic sublayer 23a are in a non-epitaxial state, deformations of the crystal structure in the vicinity of the boundary do not occur as shown in FIG. 5. Accordingly, the magnetostriction constant λ of the first magnetic sublayer 23a is not increased.

The first magnetic sublayer 23a of the pinned magnetic layer 23 may have a body-centered cubic (bcc) lattice structure. In the first magnetic sublayer 23a, an equivalent crystal plane represented by a {110} plane may be oriented in the direction parallel to the boundary.

For example, when the first magnetic sublayer 23a of the pinned magnetic layer 23 is composed of $Co_xFe_y$ (y≧20, x+y=100), the first magnetic sublayer 23a has a body-centered cubic (bcc) lattice structure.

As described above, the nonmagnetic metal layer 22 is composed of at least one element selected from the group consisting of Rh, Ir, Pd, Pt, Al, Ru, Re, Os, and Ti. The nonmagnetic metal layer 22 may have an fcc structure, and in this case, the equivalent crystal plane represented by the {111} plane is oriented in the direction parallel to the boundary. Alternatively the nonmagnetic metal layer 22 may have an hcp structure, and in this case, the C-plane is oriented in the direction parallel to the boundary.

The atomic arrangement in the equivalent crystal plane represented by the {110} plane of the crystal having a bcc structure is similar to the atomic arrangement in the equivalent crystal plane represented by the {111} plane of the crystal having an fcc structure. Therefore, the crystal having a bcc structure and the crystal having an fcc structure can be matched, that is, the atoms can be overlapped and can be oriented in a heteroepitaxial state (in which the cubic structures of the non-magnetic metal layer 22 and the fixed magnetic layer 23 are different, here fcc and bcc, while the atoms are substantially aligned, thereby straining the lattices).

The atomic arrangement in the equivalent crystal plane represented by the {110} plane of the crystal having a bcc structure is similar to the atomic arrangement in the C-plane of the crystal having an hcp structure. Therefore, the crystal having a bcc structure and the crystal having an hcp structure can be matched, that is, the atoms can be overlapped and can be oriented in a heteroepitaxial state.

Accordingly, the atoms in the first magnetic sublayer 23a and the atoms in the nonmagnetic metal layer 22 are readily overlapped with each other, and the crystals in the nonmagnetic metal layer 22 and the crystals in the first magnetic sublayer 23a of the pinned magnetic layer 23 are oriented in a heteroepitaxial state.

There is a certain amount of difference between the nearest interatomic distance in the {110} plane of the first magnetic sublayer 23a and the nearest interatomic distance in the {111} plane or in the C-plane of the nonmagnetic metal layer 22. Accordingly, in the vicinity of the boundary between the first magnetic sublayer 23a and the nonmagnetic metal layer 22, the atoms in the first magnetic sublayer 23a and the atoms in the nonmagnetic metal layer 22 overlap with each other, while each of the crystal structures is deformed. Thus, the generation of the deformations in the crystal structure of the first magnetic sublayer 23a can increase the magnetostriction constant λ.

Since $Co_xFe_y$ (y≧20, x+y=100) having a bcc structure has a magnetostriction constant λ larger than that of Co or $Co_xFe_y$ (20≧y, x+y=100), both of which have an fcc structure, in particular in about y=50 (atomic percent), this material allows a larger magnetoelastic effect to be achieved. Furthermore, $Co_xFe_y$ (y≧20, x+y=100) having a bcc structure has a large coercive force, and allows the magnetization of the pinned magnetic layer 23 to be strongly pinned.

According to the present invention, it is sufficient for most of the atoms in the first magnetic sublayer 23a and in the nonmagnetic metal layer 22 to be matched, that is, most of the atoms to be overlapped with each other, in the vicinity of the boundary between the first magnetic sublayer 23a and the nonmagnetic metal layer 22. For example, as schematically shown in FIG. 3, the boundary area may partly have regions in which the atoms in the first magnetic sublayer 23a and the atoms in the nonmagnetic metal layer 22 do not overlap.

The second magnetic sublayer 23c may be composed of either $Co_xFe_y$ (y≧20, x+y=100), which has a bcc structure, or Co or $Co_xFe_y$ (20≧y, x+y=100), both of which have fcc structures.

The use of $Co_xFe_y$ (y≧20, x+y=100) having a bcc structure as the second magnetic sublayer 23c increases the positive magnetostriction. $Co_xFe_y$ (y≧20, x+y=100) having a bcc structure has a large coercive force, and allows the magnetization of the pinned magnetic layer 23 to be strongly pinned. Furthermore, the RKKY interaction between the first magnetic sublayer 23a and the second magnetic sublayer 23c via the nonmagnetic interlayer 23b can be increased.

On the other hand, the second magnetic sublayer 23c is in contact with the nonmagnetic conductive layer 24, and greatly affects the magnetoresistive effect. The use of Co or $Co_xFe_y$ (20≧y, x+y=100) having an fcc structure decreases the deterioration of the magnetoresistive effect.

Figure 6:
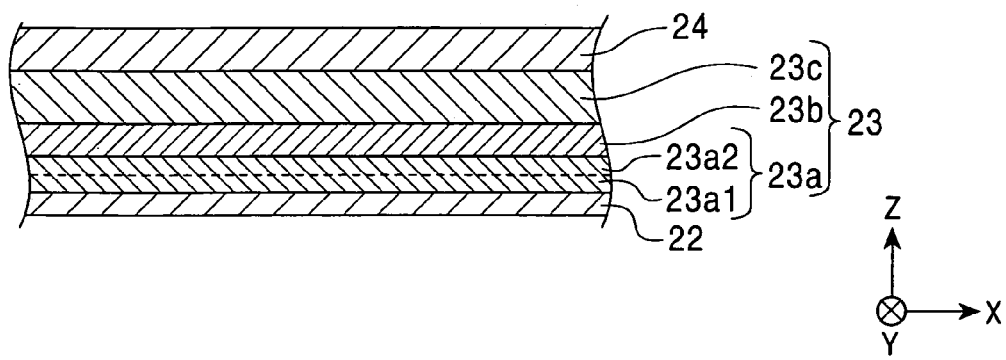
FIG. 6 is a partial sectional view in the vicinity of the pinned magnetic layer of the magnetic sensor according to the present invention.
Figure 7:
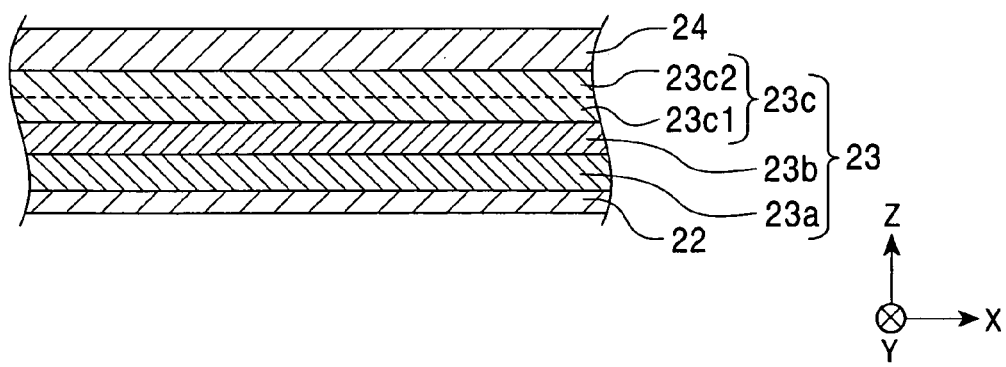
FIG. 7 is a partial sectional view in the vicinity of the pinned magnetic layer of the magnetic sensor according to the present invention.
Figure 8:
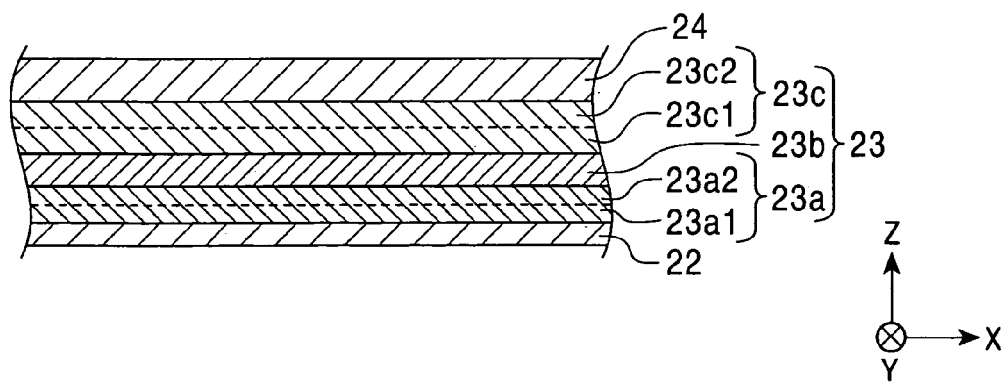
FIG. 8 is a partial sectional view in the vicinity of the pinned magnetic layer of the magnetic sensor according to the present invention.

FIGS. 6 to 8 are partial sectional views showing other embodiments of the pinned magnetic layer 23.

Referring to FIG. 6, the first magnetic sublayer 23a in the pinned magnetic layer 23 may include an fcc magnetic sublayer 23a1 adjacent to the nonmagnetic metal layer 22, and a bcc magnetic sublayer 23a2 adjacent to the nonmagnetic interlayer 23b.

An fcc magnetic sublayer 23a1 has a face-centered cubic (fcc) lattice structure, and the equivalent crystal plane represented by the {111} plane is oriented in the direction parallel to the boundary. A bcc magnetic sublayer 23a2 has a body-centered cubic (bcc) lattice structure, and the equivalent crystal plane represented by the {110} plane is oriented in the direction parallel to the boundary.

An fcc magnetic sublayer 23a1 is composed of Co or $Co_xFe_y$ (20≧y, x+y=100), and a bcc magnetic sublayer 23a2 is composed of $Co_xFe_y$ (y≧20, x+y=100).

In the vicinity of the boundary of the first magnetic sublayer 23a adjacent to the nonmagnetic interlayer 23b, the first magnetic sublayer 23a has a bcc structure, thereby increasing the magnetostriction constant λ and achieving a large magnetoelastic effect. When the first magnetic sublayer 23a adjacent to the nonmagnetic interlayer 23b is composed of $Co_xFe_y$ (y≧20, x+y=100), the RKKY interaction between the first magnetic sublayer 23a and the second magnetic sublayer 23c via the nonmagnetic interlayer 23b is increased.

On the other hand, in the vicinity of the boundary of the first magnetic sublayer 23a adjacent to the nonmagnetic metal layer 22, the first magnetic sublayer 23a has an fcc structure. In this case, the pinned magnetic layer 23, the nonmagnetic conductive layer 24, and the free magnetic layer 25 have a constant crystal orientation, and have large crystal grains, thereby increasing the magnetoresistance ratio (MR ratio).

Referring to FIG. 7, the second magnetic sublayer 23c in the pinned magnetic layer 23 may include an fcc magnetic sublayer 23c2 adjacent to the nonmagnetic conductive layer 24, and a bcc magnetic sublayer 23c1 adjacent to the nonmagnetic interlayer 23b.

An fcc magnetic sublayer 23c2 has a face-centered cubic (fcc) lattice structure, and the equivalent crystal plane represented by the {111} plane is oriented in the direction parallel to the boundary. A bcc magnetic sublayer 23c1 has a body-centered cubic (bcc) lattice structure, and the equivalent crystal plane represented by the {110} plane is oriented in the direction parallel to the boundary.

An fcc magnetic sublayer 23c2 is composed of Co or $Co_xFe_y$ (20≧y, x+y=100), and a bcc magnetic sublayer 23c1 is composed of $Co_xFe_y$ (y≧20, x+y=100).

In the vicinity of the boundary of the second magnetic sublayer 23c adjacent to the nonmagnetic interlayer 23b, the second magnetic sublayer 23c has a bcc structure, thereby increasing the magnetostriction constant λ and achieving a large magnetoelastic effect. When the second magnetic sublayer 23c adjacent to the nonmagnetic interlayer 23b is composed of $Co_xFe_y$ (y≧20, x+y=100), the RKKY interaction between the first magnetic sublayer 23a and the second magnetic sublayer 23c via the nonmagnetic interlayer 23b is increased.

On the other hand, in the vicinity of the boundary of the second magnetic sublayer 23c adjacent to the nonmagnetic conductive layer 24, the second magnetic sublayer 23c has an fcc structure, thereby suppressing the deterioration of the magnetoresistive effect.

Referring to FIG. 8, the first magnetic sublayer 23a in the pinned magnetic layer 23 may include an fcc magnetic sublayer 23a1 adjacent to the nonmagnetic metal layer 22, and a bcc magnetic sublayer 23a2 adjacent to the nonmagnetic interlayer 23b. In addition, the second magnetic sublayer 23c may include an fcc magnetic sublayer 23c2 adjacent to the nonmagnetic conductive layer 24, and a bcc magnetic sublayer 23c1 adjacent to the nonmagnetic interlayer 23b.

Referring to FIGS. 6 to 8, an fcc magnetic sublayer 23a1 and a bcc magnetic sublayer 23a2 are laminated to form the first magnetic sublayer 23a, and/or a bcc magnetic sublayer 23c1 and an fcc magnetic sublayer 23c2 are laminated to form the second magnetic sublayer 23c.

However, according to the present invention, it is sufficient that in the vicinity of the boundary of the first magnetic sublayer 23a of the pinned magnetic layer 23 adjacent to the nonmagnetic metal layer 22, the first magnetic sublayer 23a has a face-centered cubic (fcc) lattice structure, and the equivalent crystal plane represented by the {111} plane is oriented in the direction parallel to the boundary. Also, it is sufficient that in the vicinity of the boundary of the first magnetic sublayer 23a adjacent to the nonmagnetic interlayer 23b, the first magnetic sublayer 23a has a body-centered cubic (bcc) lattice structure, and the equivalent crystal plane represented by the {110} plane is oriented in the direction parallel to the boundary.

Accordingly, the first magnetic sublayer 23a of the pinned magnetic layer 23 may have the following structure. In the vicinity of the boundary of the first magnetic sublayer 23a of the pinned magnetic layer 23 adjacent to the nonmagnetic metal layer 22, the first magnetic sublayer 23a may be composed of Co or $Co_xFe_y$ (20≧y, x+y=100), and has an fcc structure, and the equivalent crystal plane represented by the {111} plane may be oriented in the direction parallel to the boundary. Furthermore, the iron content in the first magnetic sublayer 23a may gradually increase from the vicinity of the boundary adjacent to the nonmagnetic metal layer 22 to another boundary adjacent to the nonmagnetic interlayer 23b. Furthermore, in the vicinity of the boundary of the first magnetic sublayer 23a adjacent to the nonmagnetic interlayer 23b, the first magnetic sublayer 23a may be composed of $Co_xFe_y$ (y≧20, x+y=100), and has a body-centered cubic (bcc) lattice structure, and the equivalent crystal plane represented by the {110} plane may be oriented in the direction parallel to the boundary.

The second magnetic sublayer 23c may also be composed of a CoFe alloy in which the iron content gradually increases from the vicinity of the boundary adjacent to the nonmagnetic conductive layer 24 to another boundary adjacent to the nonmagnetic interlayer 23b.

Figure 9:
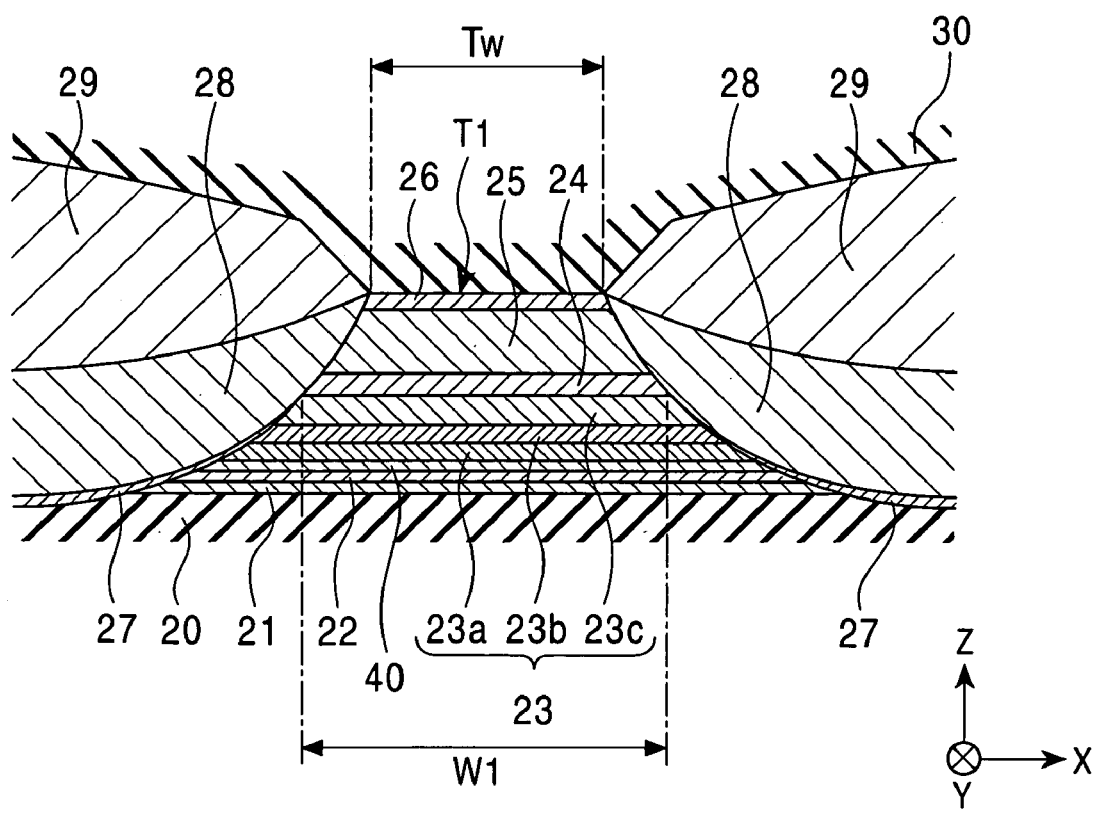
FIG. 9 is a sectional view of a magnetic sensor according to a second embodiment of the present invention, viewed from a surface facing a recording medium.

FIG. 9 is a sectional view of a magnetic sensor according to a second embodiment of the present invention, viewed from a surface facing a recording medium.

The difference between magnetic sensors shown in FIG. 9 and FIG. 1 is that the magnetic sensor shown in FIG. 9 further includes an interlayer 40. The interlayer 40 is disposed between the nonmagnetic metal layer 22 and the first magnetic sublayer 23a of the pinned magnetic layer 23, and is composed of PtMn alloy or X—Mn alloy (wherein X is at least one element selected from the group consisting of Pd, Ir, Rh, Ru, Os, Ni, and Fe).

According to the second embodiment, the interlayer 40 has a thickness of 5 Å to 50 Å. When the interlayer 40 composed of PtMn alloy or X—Mn alloy (wherein X is at least one element selected from the group consisting of Pd, Ir, Rh, Ru, Os, Ni, and Fe) has a thickness in this range, the crystal structure of the interlayer 40 maintains a face-centered cubic (fcc) structure formed when depositing the layer.

Accordingly, the atoms in the interlayer 40 and the atoms in the first magnetic sublayer 23a of the pinned magnetic layer 23 readily overlap with each other. Thus, the crystals in the interlayer 40 and the crystals in the first magnetic sublayer 23a are readily matched to be epitaxial or heteroepitaxial.

There is a certain amount of difference between the nearest interatomic distance in the {111} plane or the {110} plane of the first magnetic sublayer 23a and the nearest interatomic distance in the {111} plane of the interlayer 40. Accordingly, in the vicinity of the boundary between the first magnetic sublayer 23a and the interlayer 40, the atoms in the first magnetic sublayer 23a and the atoms in the interlayer 40 overlap with each other, while each of the crystal structures is deformed. Thus, the generation of the deformations in the crystal structure of the first magnetic sublayer 23a can increase the magnetostriction constant λ. Furthermore, the crystals in the nonmagnetic metal layer 22 and the crystals in the interlayer 40 are also readily oriented in an epitaxial state.

Furthermore, the nearest interatomic distance in the {111} plane of the interlayer 40 composed of PtMn alloy or X—Mn alloy (wherein X is at least one element selected from the group consisting of Pd, Ir, Rh, Ru, Os, Ni, and Fe) is controlled to be larger than the nearest interatomic distance in the {111} plane or in the C-plane of the nonmagnetic metal layer 22. Thus, the nearest interatomic distance in the direction parallel to the layer can be gradually increased from the seed layer 21 to the interlayer 40, thereby suppressing excessive deformation in the multilayer film T1.

The interlayer 40 having a thickness of more than 50 Å may not be preferable if the interlayer 40 is processed at 250° C. or higher because the crystal structure of the interlayer 40 is transformed into a face-centered tetragonal (fct) structure (CuAu—I type ordered structure) at 250° C. or higher. However, even if the interlayer 40 has a thickness of more than 50 Å, the crystal structure of the interlayer 40 maintains the face-centered cubic (fcc) structure formed when depositing the layer at lower than 250° C.

Figure 10:
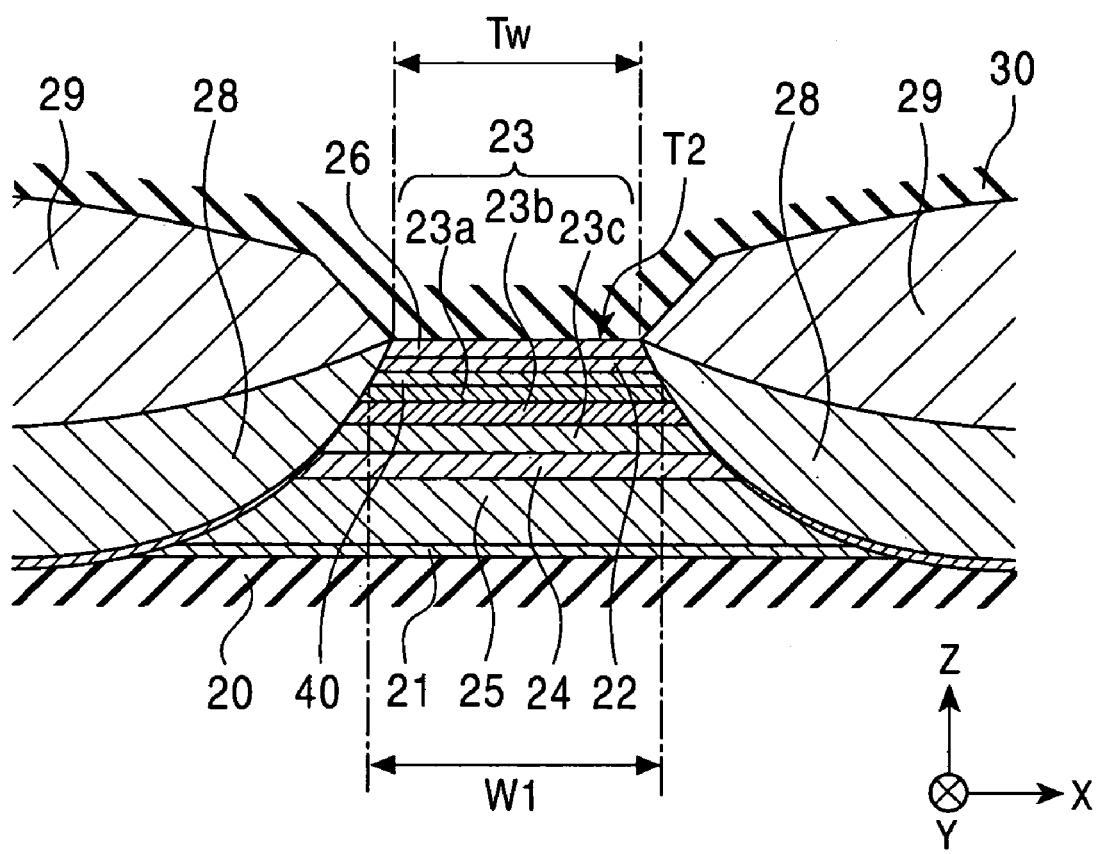
FIG. 10 is a sectional view of a magnetic sensor according to a third embodiment of the present invention, viewed from a surface facing a recording medium.

FIG. 10 is a sectional view of a magnetic sensor according to a third embodiment of the present invention, viewed from a surface facing a recording medium.

Although the magnetic sensor shown in FIG. 10 is similar to the magnetic sensor shown in FIG. 9, the magnetic sensor shown in FIG. 10 includes a multilayer film T2 instead of the multilayer film T1 in FIG. 9. The multilayer film T2 is formed by laminating, from the bottom, the seed layer 21; the free magnetic layer 25; the nonmagnetic conductive layer 24; the pinned magnetic layer 23 composed of the second magnetic sublayer 23c, the nonmagnetic interlayer 23b, and the first magnetic sublayer 23a; the interlayer 40; the nonmagnetic metal layer 22; and the protective layer 26. In other words, the laminating order in the multilayer film T2 is opposite to that in the multilayer film T1.

According to the magnetic sensor of the third embodiment, the first magnetic sublayer 23a of the pinned magnetic layer 23 is also in contact with the interlayer 40.

According to the third embodiment, the interlayer 40 also has a thickness of 5 Å' to 50 Å. The crystal structure of the interlayer 40 also maintains the face-centered cubic (fcc) structure formed when depositing the layer.

Accordingly, the atoms in the interlayer 40 and the atoms in the first magnetic sublayer 23a of the pinned magnetic layer 23 readily overlap with each other. Thus, the crystals in the interlayer 40 and the crystals in the first magnetic sublayer 23a are readily matched to be epitaxial.

Furthermore, there is a certain amount of difference between the nearest interatomic distance in the {111} plane or the {110} plane of the first magnetic sublayer 23a and the nearest interatomic distance in the {111} plane of the interlayer 40. Accordingly, in the vicinity of the boundary between the first magnetic sublayer 23a and the interlayer 40, the atoms in the first magnetic sublayer 23a and the atoms in the interlayer 40 overlap with each other, while each of the crystal structures is deformed. Thus, the generation of the deformations in the crystal structure of the first magnetic sublayer 23a can increase the magnetostriction constant λ. Furthermore, the crystals in the nonmagnetic metal layer 22 and the crystals in the interlayer 40 are also readily in an epitaxial state, thus suppressing an excessive deformation in the multilayer film T2, as in the magnetic sensor shown in FIG. 9. The nearest interatomic distances in the plane may be arranged stepwise as follows: "the nearest interatomic distance in the plane of the nonmagnetic metal layer 22">"the nearest interatomic distance in the plane of the interlayer 40">"the nearest interatomic distance in the plane of the first magnetic sublayer 23a". In this case, the matching at the boundary can be maintained, while a larger lattice deformation can be applied to the first magnetic sublayer 23a.

Even if the interlayer 40 is not formed and the nonmagnetic metal layer 22 is directly in contact with the first magnetic sublayer 23a of the pinned magnetic layer 23, the atoms in the first magnetic sublayer 23a and the atoms in the nonmagnetic metal layer 22 overlap with each other, while each of the crystal structures is deformed. Thus, the magnetostriction constant λ of the first magnetic sublayer 23a can be increased.

In order to increase the anisotropy due to the magnetoelastic effect of the pinned magnetic layer 23, the compressive stress to the multilayer film T1 or T2 from the bias base layers 27, the hard bias layers 28, and the electrode layers 29, in the direction parallel and antiparallel to the track width direction (the X direction in the figure) is increased.

For example, the compressive stress to the multilayer film T1 or T2 can be increased if the electrode layers 29 are composed of Cr (chromium), α-Ta, or Rh. For electrode layers 29 composed of Cr, the distance between the crystal planes of the electrode layers 29 in the direction parallel to the layers is 0.2044 nm (the distance between the {110} planes in the bcc structure) or more. For electrode layers 29 composed of α-Ta, the distance is 0.2337 nm (the distance between the {110} planes in the bcc structure) or more. For electrode layers 29 composed of Rh, the distance is 0.2200 nm (the distance between the {111} planes in the fcc structure) or more. In these cases, the compressive stress is applied in the directions indicated by arrows shown in FIG. 2. That is, the compressive stress is applied such that the electrode layers 29 are expanded towards the outside. Furthermore, the compressive stress is applied to the multilayer film T1 or T2 in the direction parallel and antiparallel to the track width direction (the X direction in the figure).

The distance between the crystal planes of the electrode layers 29 in the direction parallel to the layers can be measured by X-ray diffractometry or electron diffractometry. As above, in a layer composed of pure Cr, the distance between the crystal planes in the direction parallel to the layers is 0.2040 nm. In a layer composed of pure α-Ta, the distance is 0.2332 nm. In a layer composed of pure Rh, the distance is 0.2196 nm. When the distances between the crystal planes are equal to or larger than the above values, the electrode layers 29 give compressive stress to the multilayer film T1.

If the material of the electrode layers 29 is different, i.e., Cr or a soft metal such as Au, the above compressive stress is different, as follows.

For example, laminated films composed of, from the bottom, bias base layer: Cr (50 Å)/hard bias layer: CoPt (200 Å)/interlayer: Ta (50 Å)/electrode layer: Au (800 Å)/protective layer: Ta (50 Å), generate a compressive stress of 280 MPa.

On the other hand, laminated films composed of, from the bottom, bias base layer: Cr (50 Å)/hard bias layer: CoPt (200 Å)/interlayer: Ta (50 'Å)/electrode layer: Cr (1,400 Å)/protective layer: Ta (50 Å), generate a compressive stress of 670 MPa.

Although the interlayer composed of Ta (50 Å) and the protective layer composed of Ta (50 Å) are not shown in FIG. 1, the interlayer adjusts the orientation of the electrode layers, and the protective layer prevents oxidation of the underlying layer being protected.

The electrode layers 29 are deposited by ion beam sputtering. The pressure of gases such as Ar, Xe, and Kr in the sputtering apparatus is as low as $5\times10^{-3}$ to $1\times10^{-1}$ (Pa) A low pressure of the gases such as Ar, Xe, and Kr in the sputtering apparatus decreases the probability of Cr, α-Ta, or Ph atoms for forming the electrode layers colliding with Ar atoms. Therefore, the atoms such as Cr atoms are deposited while maintaining a high energy. When, for example, Cr atoms coming from the target and having a high energy collide with and are embedded on a film composed of, for example, Cr that has already been deposited, the electrode layers 29 are expanded toward the outside.

The longitudinal bias magnetic field generated from the hard bias layers 28 readily tilts the magnetization direction at both ends of the pinned magnetic layer 23 in the track width direction. However, a large compressive stress is applied to both ends of the pinned magnetic layer 23 in the track width direction. Accordingly, the anisotropy due to the magnetoelastic effect is increased at both ends of the pinned magnetic layer 23 in the track width direction, and thus, the magnetization direction can be strongly pinned in one direction.

According to the present invention, the magnetization direction of the pinned magnetic layer 23 is pinned by means of the uniaxial anisotropy based on the relationship between the compressive stress from both sides of the pinned magnetic layer 23 and the magnetostriction. The compressive stress at the pinned magnetic layer is large at both ends of the pinned magnetic layer 23 in the optical track width direction, and is small at the center. Accordingly, a large width of the pinned magnetic layer 23 in the optical track width direction decreases the fixing power in the magnetization direction at the center of the pinned magnetic layer 23. Therefore, an optical track width W1 of the pinned magnetic layer 23 is 0.15 μm or less.

The free magnetic layer 25 has a negative magnetostriction. As described above, a compressive stress is applied to the multilayer film T1 of the magnetic sensor from both sides of the multilayer film T1. Accordingly, in the free magnetic layer 25 having a negative magnetostriction, the direction parallel or antiparallel to the track width direction (the X direction in the figure) readily becomes the easy magnetization axis due to the magnetoelastic effect.

Because of a demagnetizing field, the magnetization tends to be unstable at both ends of the free magnetic layer 25 in the track width direction. However, both ends of the free magnetic layer 25 in the track width direction are disposed near the hard bias layers 28. Therefore a large compressive stress is applied to both ends of the free magnetic layer 25 in the track width direction. Accordingly, the anisotropy due to the magnetoelastic effect is increased at both ends of the free magnetic layer 25 in the track width direction, thereby stabilizing the magnetization direction.

Accordingly, even if the longitudinal bias magnetic field is decreased by reducing the thickness of the hard bias layers 28, the free magnetic layer 25 can be a stable single domain. Decreasing the longitudinal bias magnetic field by reducing the thickness of the hard bias layers 28 can stabilize magnetization pinning of the pinned magnetic layer 23 in the height direction.

Since the compressive stress at the center of the free magnetic layer 25 is smaller than the compressive stress at both ends of the magnetic layer 25, the decreasing of the detection sensitivity of the magnetic field can be suppressed.

The magnetostriction constant λ of the free magnetic layer 25 is in the range of $-0.5\times10^{-6} \geq \lambda \geq -8\times10^{-6}$. The thickness t of the hard bias layers 28 is in the range of 200 Å $\geq$ t $\geq$ 100 Å. Too small a magnetostriction constant λ of the free magnetic layer 25 or too large a thickness t of the hard bias layers 28 decreases the reproducing sensitivity of the magnetic sensor. On the other hand, too large a magnetostriction constant λ of the free magnetic layer 25 or too small a thickness t of the hard bias layers 28 tends to generate the disorder in reproducing waveforms of the magnetic sensor.

The magnetic sensors of the present embodiments shown in FIG. 1, FIG. 9, and FIG. 10 are manufactured by forming thin films by sputtering or vapor deposition and patterning these films by resist photolithography.

In order to overlap the atoms in the first magnetic sublayer 23a and the atoms in the nonmagnetic metal layer 22 or in the interlayer 40 and to generate deformations in each crystal structure, the nonmagnetic metal layer 22 or the interlayer 40, and the first magnetic sublayer 23a are deposited under, for example, the following conditions.

DC Magnetron Sputtering
Input electric power to targets: 10 to 100 W
Ar pressure: 0.01 to 0.5 Pa
Distance between the targets and a substrate: 100 to 300 mm When the magnetic sensor shown in FIG. 1 is formed, the temperature of the substrate during deposition of the first magnetic sublayer 23a is higher than that during deposition of the nonmagnetic metal layer 22. In this case, thermal expansion causes a larger deformation to be generated.

The hard bias layers 28 are formed at both sides of the multilayer film T1 in magnetic sensor shown in FIG. 1. Then, the magnetizations of the first magnetic sublayer 23a, the second magnetic sublayer 23c, and the hard bias layers 28 are directed in the height direction by applying a strong magnetic field, for example, 1,200 (kA/m) in the height direction. Then the applied magnetic field is controlled to be smaller than the spin flop magnetic field of the first magnetic sublayer 23a and the second magnetic sublayer 23c. Thus, the magnetizations of the first magnetic sublayer 23a and the second magnetic sublayer 23c are directed in antiparallel directions. The magnetic field in the height direction is removed, and then a magnetic field larger than the coercive force of the hard bias layers 28 is applied in the track width direction to magnetize the hard bias layers 28.

When the magnetic field in the track width direction is removed, the magnetizations of the first magnetic sublayer 23a and the second magnetic sublayer 23c of the pinned magnetic layer 23 are directed in directions antiparallel or parallel with respect to the height direction mainly by the magnetoelastic effect. The free magnetic layer 25 is put into a single magnetic domain state in the track width direction by the longitudinal bias magnetic field from the hard bias layers 28.

An induced anisotropy may be added to the first magnetic sublayer 23a and the second magnetic sublayer 23c of the pinned magnetic layer 23 by applying a magnetic field in the height direction during deposition of the pinned magnetic layer 23.

However, when the optical track width of the pinned magnetic layer 23 is 0.15 82 m or less, the magnetoelastic effect becomes very large. In particular, according to the present invention, the magnetostriction constants λ of the first magnetic sublayer 23a and the second magnetic sublayer 23c and the compressive stress in the track width direction applied to the multilayer film are increased. Therefore, the magnetization of the pinned magnetic layer 23 is mainly pinned by the magnetoelastic effect.

According to the present embodiments, layered products composed of the hard bias layers 28 and the electrode layers 29 are formed at both sides of the multilayer film T1 or T2. These layered products apply the compressive stress to the multilayer film T1 or T2. However, at both sides of the multilayer film T1 or T2, the hard bias layers 28 are not always required. For example, layered products composed of a soft magnetic layer and an antiferromagnetic layer may be disposed at both sides of the multilayer film T1 or T2. Alternatively, an insulating layer may be disposed at both sides of the multilayer film T1 or T2.

The magnetic sensor according to the present invention may be used as a magnetic sensor in which the sense current flows in the direction perpendicular to the thickness of the multilayer film T1 or T2, for example, a tunneling, magnetoresistive element or a current perpendicular to plane giant magnetoresistive (CPP-GMR) magnetic sensor. In this case, the electrode layers are formed on the multilayer film T1 or T2 and under the multilayer film T1 or T2.

EXAMPLES

The following multilayer films were formed and were annealed at 290° C. for four hours. Then the magnetostriction of each film was measured.

One multilayer film included a silicon substrate/alumina (1,000 Å)/($Ni_{0.8}Fe_{0.2})_{60}Cr_{40}$ (52 Å)/nonmagnetic metal layer (underlayer)/pin 1 layer/Ru (9 Å)/pin 2 (40 Å)/Cu (85 Å)/Ta (30 Å).

According to this multilayer film, for example, the second magnetic sublayer, the nonmagnetic conductive layer, and the free magnetic layer are not formed, thereby permitting accurate measurement of the magnetostriction of the first magnetic sublayer 23a. The nonmagnetic metal layer (i.e., underlayer) is composed of Ru or $Pt_{50}Mn_{50}$ (atomic percent); a pin 1 layer is composed of Co, $Co_{90}Fe_{10}$ (atomic percent), or $Fe_{50}Co_{50}$ (atomic percent); and a pin 2 layer is composed of Co or $Co_{90}Fe_{10}$ (atomic percent). Hereinafter, the $Co_{90}Fe_{10}$ (atomic percent) is referred to as "CoFe" and the $Fe_{50}Co_{50}$ (atomic percent) is referred to as "FeCo".

The magnetostriction was measured by a bending method. In the bending method, the multilayer film is incurvated to form a uniaxial deformation. The magnetostriction constant is measured using the change of the uniaxial anisotropy due to the inverse magnetostrictive effect.

Figure 11:
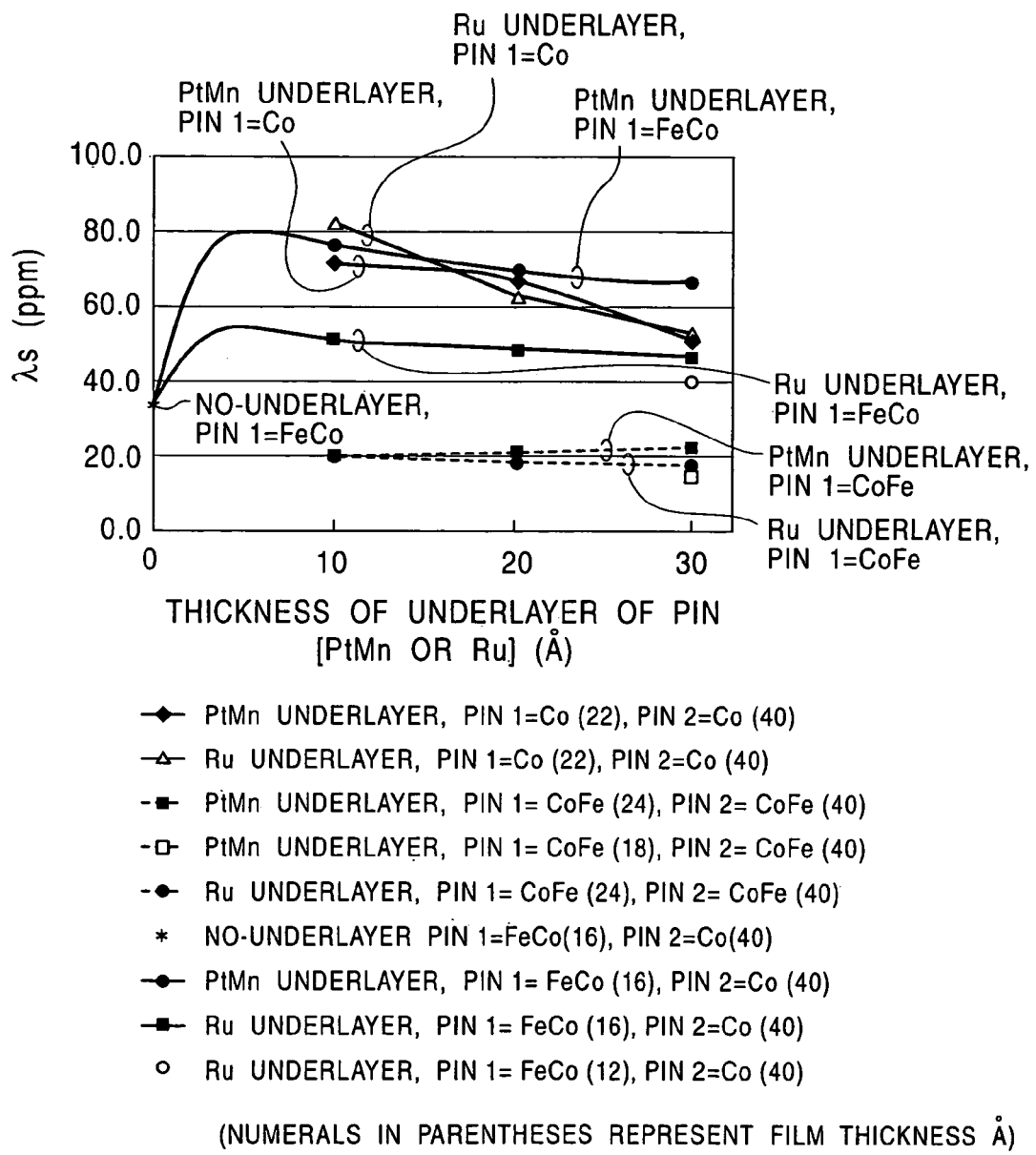
FIG. 11 is a graph showing the magnetostriction of multilayer films formed by laminating the nonmagnetic metal layer and ferromagnetic sublayers.
Figure 12:
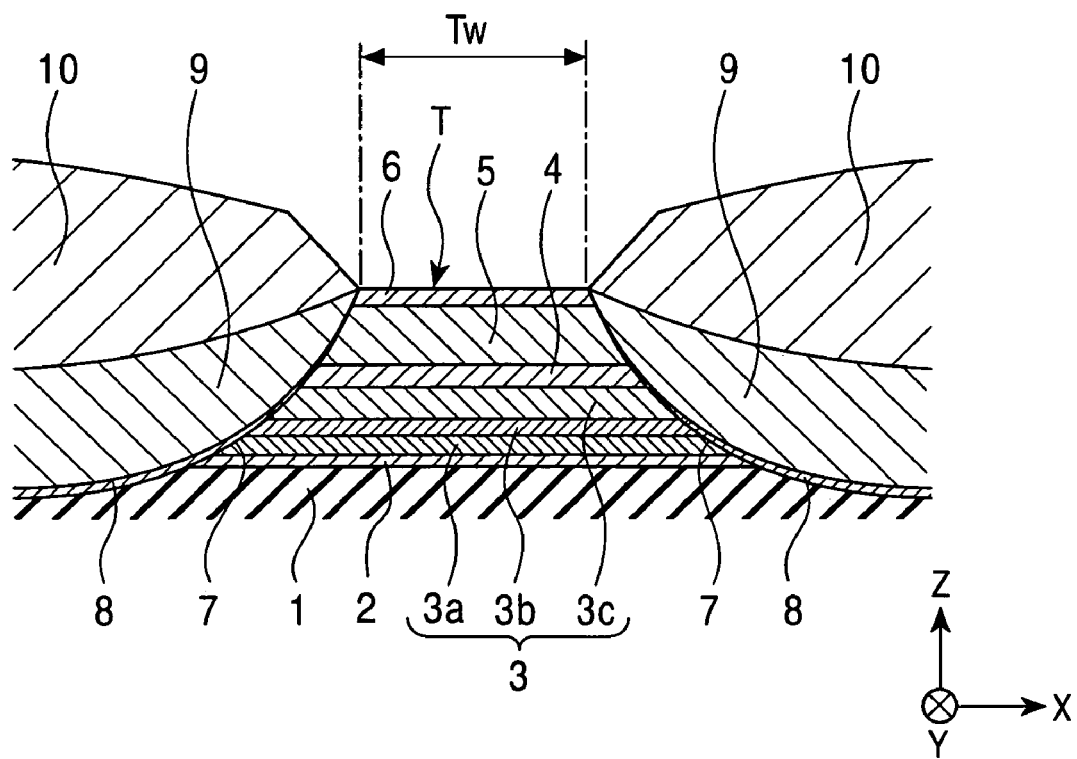
FIG. 12 is a sectional view of a known magnetic sensor, viewed from a surface facing a recording medium.

FIG. 11 shows the results. According to the results of this experiment, in both cases where the nonmagnetic metal layer is composed of Ru and where the nonmagnetic metal layer is composed of $Pt_{50}Mn_{50}$ (atomic percent), the magnetostriction constant of a multilayer film having a pin 1 layer composed of Co or FeCo is larger than that of a multilayer film having a pin 1 layer composed of CoFe. Even if a deformation is generated in CoFe, the magnetostriction is not changed by an extensive amount, compared with Co and FeCo. This may be one reason for the above results.

A multilayer film that includes a nonmagnetic metal layer has a magnetostriction constant larger than that of a multilayer film that does not include a nonmagnetic metal layer.

In a multilayer film having a pin 1 layer composed of Co, the increases of the magnetostriction constant are almost the same between a multilayer film having the nonmagnetic metal layer composed of Ru and a multilayer film having a nonmagnetic metal layer composed of $Pt_{50}Mn_{50}$ (atomic percent).

When the multilayer film has a Co or FeCo pin 1 layer, in the area where the thickness of the nonmagnetic metal layer is about 5 Å or more, as the thickness increases, the magnetostriction constant is gradually decreased. This is because a nonmagnetic metal layer having a large thickness readily allows the boundary between the nonmagnetic metal layer and the pin 1 layer to be mismatched. To the contrary, a nonmagnetic metal layer having a small thickness readily allows the lattice constant of the nonmagnetic metal layer to be changed. Therefore, the nonmagnetic metal layer and the pin 1 layer are readily matched at the boundary while having deformations.

Although embodiments of the present invention were described above, various modifications can be applied without deviating from the scope of the present invention. The embodiments described above exemplify the present invention, but do not serve to limit the present invention. For example, although absolute numbers are given throughout this disclosure, such as the compositions of the first and second magnetic sublayers or the optical track width of the pinned magnetic layer, deviations from these numbers are not outside of the scope of the present invention.

What is claimed is:

1. A magnetic sensor comprising:
   a nonmagnetic metal layer including at least one element selected from the group consisting of Ru, Re, Os, Ti, Rh, Ir, Pd, Pt, and Al;
   a pinned magnetic layer including first and second magnetic sublayers with a nonmagnetic interlayer disposed therebetween, the first magnetic sublayer in contact with the non-magnetic metal layer;
   a free magnetic layer; and
   a nonmagnetic conductive layer disposed between the pinned magnetic layer and the free magnetic layer, the first magnetic sublayer disposed farthest from the nonmagnetic conductive layer,
   wherein crystals in the nonmagnetic metal layer and crystals in the first magnetic sublayer are oriented in an epitaxial or a heteroepitaxial state; and
   an end face of the pinned magnetic layer is open and is configured to oppose a face of a recording medium.

2. The magnetic sensor according to claim 1,
   wherein the nonmagnetic metal layer comprises at least one element selected from the group consisting of Rh, Ir, Pd, Pt, and Al; and
   the nonmagnetic metal layer has a face-centered cubic (fcc) lattice structure in at least in the vicinity of a boundary adjacent to the first magnetic sublayer of the pinned magnetic layer, and the nonmagnetic metal layer has an equivalent crystal plane represented by a {111} plane oriented in a direction parallel to the boundary.

3. The magnetic sensor according to claim 1,
   wherein the nonmagnetic metal layer comprises at least one element selected from the group consisting of Ru, Re, Os, and Ti; and
   the nonmagnetic metal layer has a hexagonal close-packed (hcp) structure at least in the vicinity of a boundary adjacent to the first magnetic sublayer of the pinned magnetic layer, and the nonmagnetic metal layer has a C-plane ({0001} plane) oriented in a direction parallel to the boundary.

4. The magnetic sensor according to claim 1, further comprising:
   bias layers to supply the free magnetic layer with a longitudinal bias magnetic field, the bias layers being disposed at side ends of the free magnetic layer and the pinned magnetic layer.

5. The magnetic sensor according to claim 1, wherein the first magnetic sublayer of the pinned magnetic layer has a face-centered cubic (fcc) lattice structure at least in the vicinity of a boundary adjacent to the nonmagnetic metal layer, and the first magnetic sublayer has an equivalent crystal plane represented by a {111} plane oriented in a direction parallel to the boundary.

6. The magnetic sensor according to claim 5, wherein the first magnetic sublayer of the pinned magnetic layer comprises Co or $Co_xFe_y$ (in which about $20 \geq y$, x+y=about 100, and x and y are atomic percent).

7. The magnetic sensor according to claim 1, wherein the first magnetic sublayer of the pinned magnetic layer has a body-centered cubic (bcc) lattice structure in at least the vicinity of a boundary adjacent to the nonmagnetic metal layer, and the first magnetic sublayer has an equivalent crystal plane represented by a {110} plane oriented in a direction parallel to the boundary.

8. The magnetic sensor according to claim 7, wherein the first magnetic sublayer of the pinned magnetic layer comprises $Co_xFe_y$ (in which $y \geq$ about 20, x+y=about 100, and x and y are atomic percent).

9. The magnetic sensor according to claim 1,
   wherein the first magnetic sublayer of the pinned magnetic layer has a face-centered cubic (fcc) lattice structure in the vicinity of the first boundary adjacent to the nonmagnetic metal layer, and the first magnetic sublayer has an equivalent crystal plane represented by a {111} plane oriented in a direction parallel to the first boundary; and
   the first magnetic sublayer of the pinned magnetic layer has a body-centered cubic (bcc) lattice structure in the vicinity of a second boundary adjacent to the nonmagnetic interlayer, and the first magnetic sublayer has an equivalent crystal plane represented by the {110} plane oriented in a direction parallel to the second boundary.

10. The magnetic sensor according to claim 9,
    wherein the first magnetic sublayer of the pinned magnetic layer comprises, in the vicinity of the first boundary: $Co_xFe_y$ (in which about $20 \geq y$, x+y=about 100, x and y are atomic percent) or Co; and
    the first magnetic sublayer of the pinned magnetic layer comprises $Co_xFe_y$ (in which $y \geq$ about 20, x+y=about 100, x and y are atomic percent) in the vicinity of the second boundary.

11. The magnetic sensor according to claim 10, wherein the first magnetic sublayer contains Fe, and an Fe content gradually increases from the first boundary to the second boundary.

12. The magnetic sensor according to claim 1, wherein a difference between a nearest interatomic distance of the nonmagnetic metal layer in a plane parallel to a boundary between the nonmagnetic metal layer and the first magnetic sublayer and a nearest interatomic distance of the first magnetic sublayer of the pinned magnetic layer in the plane parallel to the boundary divided by the nearest interatomic distance of the first magnetic sublayer is in the range of about 0.05 to 0.20.

13. The magnetic sensor according to claim 1, further comprising:
    an interlayer disposed between the nonmagnetic metal layer and the first magnetic sublayer of the pinned magnetic layer, the interlayer comprising a PtMn alloy or X—Mn alloy (wherein X is at least one element selected from the group consisting of Pd, Ir, Rh, Ru, Os, Ni, and Fe).

14. The magnetic sensor according to claim 13,
    wherein the crystals in the nonmagnetic metal layer and crystals in the interlayer are oriented in an epitaxial state; and the crystals in the interlayer and crystals in the pinned magnetic layer are oriented in an epitaxial or a heteroepitaxial state.

15. The magnetic sensor according to claim 13, wherein a thickness of the interlayer is between about 5 Å and 50 Å.

16. The magnetic sensor according to claim 1, further comprising:
electrode layers disposed at sides of the free magnetic layer, the nonmagnetic conductive layer, and the pinned magnetic layer, the electrode layers containing Cr, α-Ta, or Rh.

17. The magnetic sensor according to claim 16, wherein:
if the electrode layers comprise Cr, which has a bcc structure, a distance between {110} crystal planes of the electrode layers in a direction parallel to the layers is at least about 0.2044 nm;
if the electrode layers comprise α-Ta, which has a bcc structure, the distance between {110} crystal planes of the electrode layers in a direction parallel to the layers is at least about 0.2337 nm; and
if the electrode layers comprise Rh, which has an fcc structure, the distance between {111} crystal planes of the electrode layers in the direction parallel to the layers is at least about 0.2200 nm.

18. The magnetic sensor according to claim 1, wherein an optical track width of the pinned magnetic layer is at most about 0.15 μm.

19. The magnetic sensor according to claim 1,
wherein the nonmagnetic metal layer has one of:
a face-centered cubic (fcc) lattice structure throughout the nonmagnetic metal layer and has an equivalent crystal plane represented by a {111} plane oriented in a direction parallel to a boundary between the nonmagnetic metal layer and the first magnetic sublayer; and
a hexagonal close-packed (hcp) structure throughout the nonmagnetic metal layer and has a C-plane ({0001} plane) oriented in the direction parallel to the boundary.

20. The magnetic sensor according to claim 1,
wherein the first magnetic sublayer has one of:
a face-centered cubic (fcc) lattice structure throughout the first magnetic sublayer and has an equivalent crystal plane represented by a {111} plane oriented in a direction parallel to a boundary between the nonmagnetic metal layer and the first magnetic sublayer; and
a body-centered cubic (bcc) lattice structure throughout the first magnetic sublayer and has an equivalent crystal plane represented by a {110} plane oriented in the direction parallel to the boundary.

21. The magnetic sensor according to claim 1, wherein the first magnetic sublayer comprises a magnetic material having a positive magnetostriction constant.

22. The magnetic sensor according to claim 1, further comprising a seed layer containing NiFe alloy, NiFeCr alloy, Cr, or Ta and having a thickness of about 35 Å to 60 Å and on which the nonmagnetic metal layer, the pinned magnetic layer, the free magnetic layer, and the nonmagnetic conductive layer are disposed.

23. The magnetic sensor according to claim 1, wherein at least one of the first and second magnetic sublayers comprise a plurality of sublayers, the plurality of sublayers including a bcc magnetic sublayer provided at a nonmagnetic interlayer side and, if the first magnetic layer contains the plurality of sublayers, an fcc magnetic sublayer provided at a non-magnetic metal layer side, or if the second magnetic layer contains the plurality of sublayers, an fcc magnetic sublayer provided at a non-magnetic material layer side.

24. A magnetic sensor comprising:
a nonmagnetic metal layer;
a pinned magnetic layer including first and second magnetic sublayers with a nonmagnetic interlayer disposed therebetween, the first magnetic sublayer in contact with the non-magnetic metal layer;
a free magnetic layer; and
a nonmagnetic conductive layer disposed between the pinned magnetic layer and the free magnetic layer, the first magnetic sublayer disposed farthest from the nonmagnetic conductive layer,
wherein the nonmagnetic metal layer and the first magnetic sublayer have crystalline lattices in which
difference between a nearest interatomic distance of the nonmagnetic metal layer in a plane parallel to a first boundary between the nonmagnetic metal layer and the first magnetic sublayer and a nearest interatomic distance of the first magnetic sublayer of the pinned magnetic layer in the plane parallel to the first boundary divided by the nearest interatomic distance of the first magnetic sublayer is in the range of about 0.05 to 0.20, and
an end face of the pinned magnetic layer is open and is configured to oppose a face of a recording medium.

25. The magnetic sensor according to claim 24,
wherein the nonmagnetic metal layer has a thickness of about 5 Å to 30 Å, the first magnetic sublayer has a thickness of about 10 Å to 30 Å, and the second magnetic sublayer has a thickness of about 15 Å to 35 Å.

26. The magnetic sensor according to claim 24,
wherein the nonmagnetic metal layer and the first magnetic sublayer have the same type of crystalline lattice at the first boundary.

27. The magnetic sensor according to claim 26,
wherein the type of crystalline lattice of at least one of the nonmagnetic metal layer and the first magnetic sublayer remains the same throughout the at least one of the nonmagnetic metal layer and the first magnetic sublayer.

28. The magnetic sensor according to claim 24,
wherein the nonmagnetic metal layer and the first magnetic sublayer have different types of crystalline lattices at the first boundary.

29. The magnetic sensor according to claim 28,
wherein the type of crystalline lattice of at least one of the nonmagnetic metal layer and the first magnetic sublayer remains the same throughout the at least one of the nonmagnetic metal layer and the first magnetic sublayer.

30. The magnetic sensor according to claim 24, wherein the composition of the first magnetic sublayer gradually changes between the first boundary to a second boundary between the first magnetic sublayer and the nonmagnetic interlayer.

31. The magnetic sensor according to claim 24, wherein the first magnetic sublayer comprises a magnetic material having a positive magnetostriction constant.

32. The magnetic sensor according to claim 24, further comprising bias layers to supply the free magnetic layer with a longitudinal bias magnetic field, the bias layers being disposed at side ends of the free magnetic layer and the pinned magnetic layer, a thickness t of the bias layers being about $200 \text{ Å} \geq t \geq 100 \text{ Å}$.

33. The magnetic sensor according to claim 24, wherein a magnetostriction constant λ of the free magnetic layer is about $-0.5 \times 10^{-6} \geq \lambda \geq -8 \times 10^{-6}$.

34. The magnetic sensor according to claim 24, wherein the nonmagnetic metal layer comprises at least one element selected from the group consisting of Ru, Re, Os, Ti, Rh, Ir, Pd, Pt, and Al, and the first magnetic sublayer comprises Co or an CoFe alloy.

35. The magnetic sensor according to claim 34, wherein a Fe content of the first magnetic sublayer gradually increases from a maximum of about 20 at % at the first boundary to a minimum of about 20 at % at a second boundary between the first magnetic sublayer and the nonmagnetic interlayer.

36. The magnetic sensor according to claim 24, wherein an optical track width of the pinned magnetic layer is at most about 0.15 μm.

37. The magnetic sensor according to claim 24, wherein a thickness of the interlayer is between about 5 Å and 50 Å.

38. The magnetic sensor according to claim 24, further comprising a seed layer containing NiFe alloy, NiFeCr alloy, Cr, or Ta and having a thickness of about 35 Å to 60 Å and on which the nonmagnetic metal layer, the pinned magnetic layer, the free magnetic layer, and the nonmagnetic conductive layer are disposed.

39. The magnetic sensor according to claim 24, wherein at least one of the first and second magnetic sublayers comprise a plurality of sublayers, the plurality of sublayers including a bcc magnetic sublayer provided at a nonmagnetic interlayer side and, if the first magnetic layer contains the plurality of sublayers, an fcc magnetic sublayer provided at a non-magnetic metal layer side, or if the second magnetic layer contains the plurality of sublayers, an fcc magnetic sublayer provided at a non-magnetic material layer side.

40. A method of forming a magnetic sensor, the method comprising:
providing a nonmagnetic metal layer including at least one element selected from the group consisting of Ru, Re, Os, Ti, Rh, Ir, Pd, Pt, and Al;
forming a pinned magnetic layer including first and second magnetic sublayers with a nonmagnetic interlayer disposed therebetween such that the first magnetic sublayer is in contact with the non-magnetic metal layer and crystals in the nonmagnetic metal layer and crystals in the first magnetic sublayer are oriented in an epitaxial or a heteroepitaxial state;
forming a free magnetic layer;
forming a nonmagnetic conductive layer disposed between the pinned magnetic layer and the free magnetic layer such that the first magnetic sublayer is disposed farthest from the nonmagnetic conductive layer; and
opening an end face of the pinned magnetic layer, the end face being configured to oppose a face of a recording medium.

41. The method according to claim 40, wherein a temperature of a substrate on which the pinned magnetic layer and the nonmagnetic metal layer are formed is higher during deposition of the first magnetic sublayer than during deposition of the nonmagnetic metal layer.

42. The method according to claim 40, further comprising annealing the nonmagnetic metal layer, the pinned magnetic layer, the free magnetic layer, and the nonmagnetic conductive layer at at least about 290° C. for at least about four hours.

43. The method according to claim 40, further comprising varying the composition of the first magnetic sublayer such that the composition gradually changes between a first boundary between the nonmagnetic metal layer and the first magnetic sublayer and a second boundary between the first magnetic sublayer and the nonmagnetic interlayer.

44. The method according to claim 43, further comprising gradually increasing an amount of Fe in the first magnetic sublayer contains Fe from the first boundary to the second boundary.

45. The method according to claim 44, wherein the first magnetic sublayer of the pinned magnetic layer comprises:
in the vicinity of the first boundary $Co_xFe_y$ (in which about $20 \geqq y$, x+y=about 100, x and y are atomic percent) or Co; and
in the vicinity of the second boundary $Co_xFe_y$ (in which $y \geqq$ about 20, x+y=about 100, x and y are atomic percent).

46. The method according to claim 40, further comprising forming the nonmagnetic metal layer and the first magnetic sublayer such that a difference between a nearest interatomic distance of the nonmagnetic metal layer in a plane parallel to a boundary between the nonmagnetic metal layer and the first magnetic sublayer and a nearest interatomic distance of the first magnetic sublayer of the pinned magnetic layer in the plane parallel to the boundary divided by the nearest interatomic distance of the first magnetic sublayer is in the range of about 0.05 to 0.20.

47. The method according to claim 40, further comprising forming an interlayer between the nonmagnetic metal layer and the first magnetic sublayer of the pinned magnetic layer, the interlayer comprising a PtMn alloy or X—Mn alloy (wherein X is at least one element selected from the group consisting of Pd, Ir, Rh, Ru, Os, Ni, and Fe).

48. The method according to claim 47, further comprising forming the nonmagnetic metal layer, the pinned magnetic layer, and the interlayer such that the crystals in the nonmagnetic metal layer and crystals in the interlayer are oriented in an epitaxial state and the crystals in the interlayer and crystals in the pinned magnetic layer are oriented in an epitaxial or a heteroepitaxial state.

49. The method according to claim 40, further comprising limiting an optical track width of the pinned magnetic layer to at most about 0.15 μm.

50. The method according to claim 40, further comprising limiting a thickness of the interlayer to between about 5 Å and 50 Å.

51. The method according to claim 40, further comprising applying a uniaxial stress to the pinned magnetic layer in a height direction during deposition or in a heat treatment after deposition, to orient polycrystals that form the first magnetic sublayer into a uniaxis.

52. The method according to claim 51, further comprising applying a magnetic field to the pinned magnetic layer in a height direction during deposition or subsequent heat treatment of the pinned magnetic layer.

* * * * *